(12) United States Patent
Hwang et al.

(10) Patent No.: US 11,715,712 B2
(45) Date of Patent: Aug. 1, 2023

(54) NONVOLATILE MEMORY DEVICE AND METHOD FOR FABRICATING THE SAME

(71) Applicant: SAMSUNG ELECTRONICS CO., LTD., Suwon-si (KR)

(72) Inventors: Sung-Min Hwang, Hwaseong-si (KR); Ji Won Kim, Seoul (KR); Jae Ho Ahn, Seoul (KR); Joon-Sung Lim, Seongnam-si (KR); Suk Kang Sung, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 149 days.

(21) Appl. No.: 17/323,076

(22) Filed: May 18, 2021

(65) Prior Publication Data
US 2022/0108963 A1 Apr. 7, 2022

(30) Foreign Application Priority Data
Oct. 5, 2020 (KR) .................. 10-2020-0127835

(51) Int. Cl.
*H01L 23/00* (2006.01)
*H01L 25/065* (2023.01)
*H01L 25/18* (2023.01)

(52) U.S. Cl.
CPC ............ *H01L 24/08* (2013.01); *H01L 23/562* (2013.01); *H01L 25/0657* (2013.01); *H01L 25/18* (2013.01); *H01L 2224/08145* (2013.01); *H01L 2924/1431* (2013.01); *H01L 2924/14511* (2013.01); *H01L 2924/3511* (2013.01)

(58) Field of Classification Search
CPC ..... H01L 24/08; H01L 25/0657; H01L 25/18; H01L 23/562; H01L 2224/08145; H01L 2924/1431; H01L 2924/14511; H01L 2924/3511; H10B 80/00
See application file for complete search history.

(56) References Cited

U.S. PATENT DOCUMENTS

| | | | |
|---|---|---|---|
| 9,548,316 B2 | 1/2017 | Lim et al. | |
| 9,852,999 B2 | 12/2017 | Kaltalioglu et al. | |
| 10,147,732 B1 | 12/2018 | Hu et al. | |
| 10,283,452 B2 | 5/2019 | Zhu et al. | |
| 10,529,736 B2 | 1/2020 | Song et al. | |
| 10,580,788 B2 | 3/2020 | Zhu et al. | |
| 11,322,509 B2 * | 5/2022 | Baraskar | H10B 41/35 |
| 2019/0296041 A1 | 9/2019 | Yamasaka et al. | |
| 2020/0335487 A1 * | 10/2020 | Rajashekhar | H01L 25/50 |

* cited by examiner

*Primary Examiner* — Benjamin Tzu-Hung Liu
(74) *Attorney, Agent, or Firm* — F. Chau & Associates, LLC

(57) ABSTRACT

A nonvolatile memory device includes an upper insulating layer. A first substrate is on the upper insulating layer. An upper interlayer insulating layer is on the first substrate. A plurality of word lines is stacked on the first substrate in a first direction and extends through a partial portion of the upper interlayer insulating layer. A lower interlayer insulating layer is on the upper interlayer insulating layer. A second substrate is on the lower interlayer insulating layer. A lower insulating layer is on the second substrate. A dummy pattern is composed of dummy material. The dummy pattern is disposed in a trench formed in at least one of the first and second substrates. The trench is formed on at least one of a surface where the upper insulating layer meets the first substrate, and a surface where the lower insulating layer meets the second substrate.

20 Claims, 19 Drawing Sheets

NONVOLATILE MEMORY DEVICE AND METHOD FOR FABRICATING THE SAME

CROSS-REFERENCE TO RELATED APPLICATION

This application claims priority under 35 U.S.C. § 119 to Korean Patent Application No. 10-2020-0127835, filed on Oct. 5, 2020 in the Korean Intellectual Property Office, the disclosure of which is incorporated by reference in its entirety herein.

TECHNICAL FIELD

The present inventive concepts relate to a nonvolatile memory device, a nonvolatile memory system including the same, and a method for fabricating the same. More particularly, the present inventive concepts relate to a nonvolatile memory device including a dummy pattern in a substrate, a nonvolatile memory system including the same, and a method for fabricating the same.

DISCUSSION OF RELATED ART

A semiconductor memory device may be broadly classified into a volatile memory device and a nonvolatile memory device. The integration density of nonvolatile memory devices has been increasing to satisfy consumer demands for high performance and relatively inexpensive prices. However, in the case of a two-dimensional or a planar memory device, the integration density is determined by the area occupied by a unit memory cell. Therefore, a three-dimensional memory device in which unit memory cells are vertically arranged has been developed to provide a high integration density while reducing the size of the unit memory cell.

SUMMARY

Aspects of the present inventive concepts provide a nonvolatile memory device for preventing occurrence of warpage.

Aspects of the present inventive concepts also provide a nonvolatile memory system for preventing occurrence of warpage.

Aspects of the present inventive concepts also provide a nonvolatile memory device fabricating method capable of fabricating a nonvolatile memory device for preventing occurrence of warpage.

According to an embodiment of the present inventive concepts, a nonvolatile memory device includes an upper insulating layer. A first substrate is on the upper insulating layer. An upper interlayer insulating layer is on the first substrate. A plurality of word lines is stacked on the first substrate in a first direction and extends through a partial portion of the upper interlayer insulating layer. A lower interlayer insulating layer is on the upper interlayer insulating layer. A second substrate is on the lower interlayer insulating layer. A lower insulating layer is on the second substrate. A dummy pattern is composed of dummy material. The dummy pattern is disposed in a trench formed in at least one of the first and second substrates. The trench is formed on at least one of a surface where the upper insulating layer meets the first substrate, and a surface where the lower insulating layer meets the second substrate.

According to an embodiment of the present inventive concepts, a nonvolatile memory device includes an upper insulating layer. A first substrate is on the upper insulating layer. An upper interlayer insulating layer is on the first substrate. A plurality of word lines is stacked on the first substrate in a first direction and extends through a partial portion of the upper interlayer insulating layer. A channel structure extends in the first direction to penetrate the plurality of word lines and a partial portion of the upper interlayer insulating layer. A lower interlayer insulating layer is on the upper interlayer insulating layer. A second substrate is on the lower interlayer insulating layer. A lower insulating layer is on the second substrate. A dummy pattern is composed of dummy material. The dummy pattern is disposed in a trench formed in at least one of the first and second substrates. The trench is formed on at least one of a surface where the upper insulating layer meets the first substrate, and a surface where the lower insulating layer meets the second substrate.

According to an embodiment of the present inventive concepts, a nonvolatile memory system includes a main substrate. A nonvolatile memory device is on the main substrate. A controller is electrically connected to the nonvolatile memory device on the main substrate. The nonvolatile memory device includes an upper insulating layer. A first substrate is on the upper insulating layer. An upper interlayer insulating layer is on the first substrate. A plurality of word lines is stacked on the first substrate in a first direction and extends through a partial portion of the upper interlayer insulating layer. A lower interlayer insulating layer is on the upper interlayer insulating layer. A second substrate is on the lower interlayer insulating layer. A lower insulating layer is on the second substrate. A dummy pattern is composed of dummy material. The dummy pattern is disposed in a trench formed in at least one of the first and second substrates. The trench is formed on at least one of a surface where the upper insulating layer meets the first substrate and a surface where the lower insulating layer meets the second substrate.

BRIEF DESCRIPTION OF THE DRAWINGS

The above and other aspects and features of the present inventive concepts will become more apparent by describing in detail embodiments thereof with reference to the attached drawings, in which.

DETAILED DESCRIPTION OF EMBODIMENTS

Figure 1:
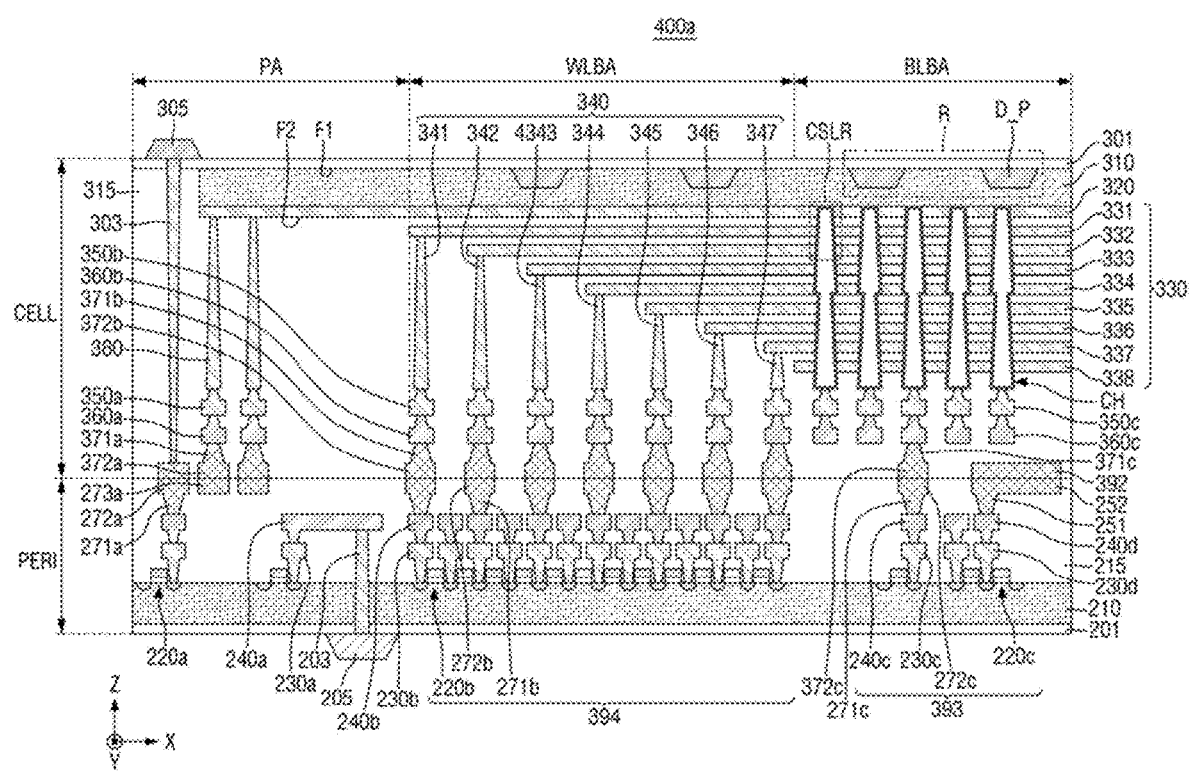
FIG. 1 is a cross-sectional view illustrating a nonvolatile memory device according to an embodiment of the present inventive concepts.
Figure 2:
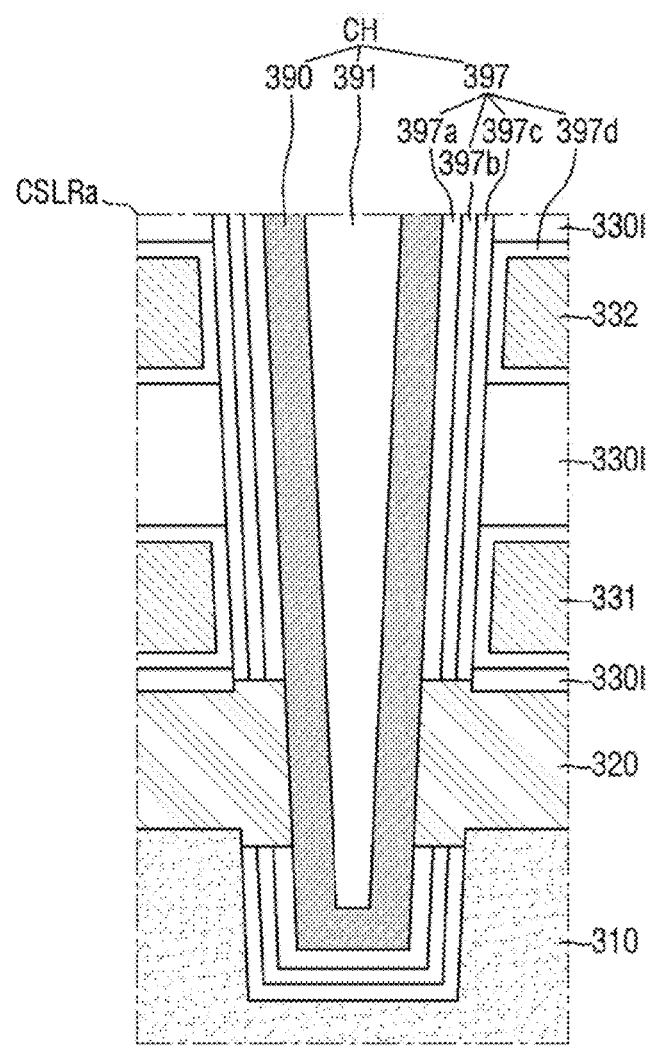
FIGS. 2 and 3 are enlarged cross-sectional views of area CSLR of FIG. 1 according to embodiments of the present inventive concepts.
Figure 3:
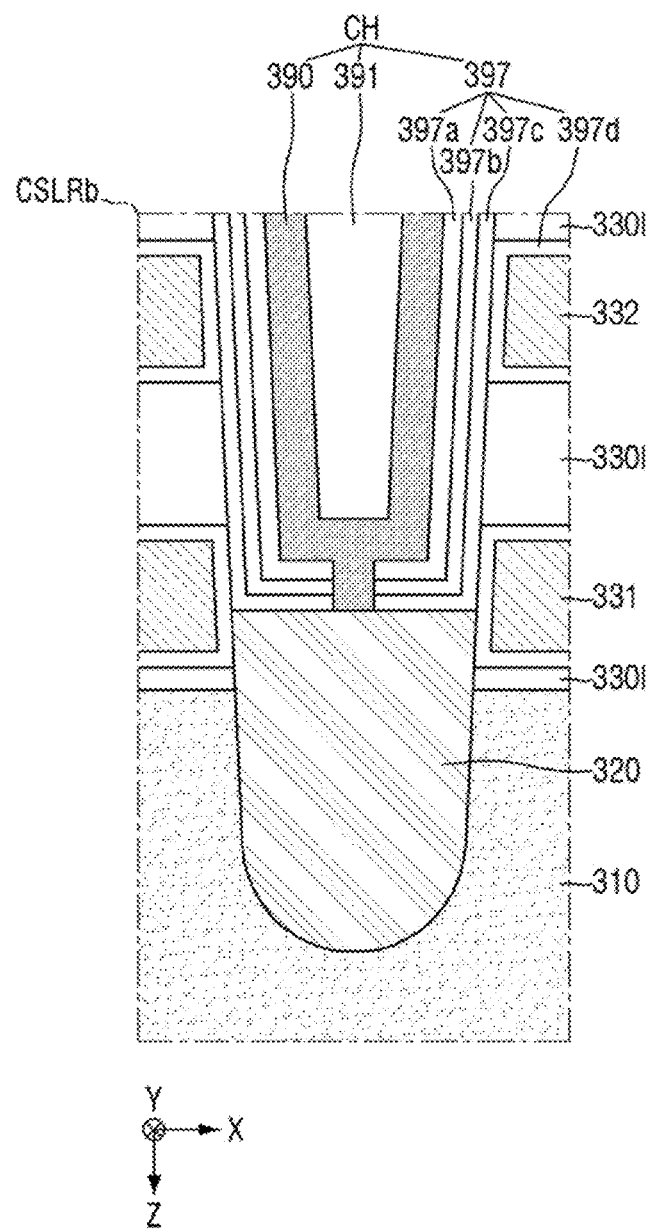

FIG. 1 is a cross-sectional view illustrating a nonvolatile memory device according to an embodiment of the present inventive concepts. FIGS. 2 and 3 are enlarged cross-sectional views of area CSLR of FIG. 1 according to embodiments of the present inventive concepts.

Referring to FIG. 1, a nonvolatile memory device 400a according to an embodiment of the present inventive concepts may have a chip to chip (C2C) structure. The C2C structure may mean a structure obtained by manufacturing an upper chip including a cell region CELL on a first wafer, manufacturing a lower chip including a peripheral circuit region PERI on a second wafer different from the first wafer, and connecting the upper chip and the lower chip to each other by a bonding method. In an embodiment, the bonding method may mean a method of electrically connecting a bonding metal formed on an uppermost metal layer of the upper chip to a bonding metal formed on an uppermost metal layer of the lower chip. For example, in an embodiment in which the bonding metal is formed of copper (Cu), the bonding method may be a Cu—Cu bonding method, and the bonding metal may also be formed of aluminum or tungsten.

As shown in the embodiment of FIG. 1, the peripheral circuit region PERI and the cell region CELL of the nonvolatile memory device 400a may each include an external pad bonding area PA, a word line bonding area WLBA, and a bit line bonding area BLBA.

The peripheral circuit region PERI may include a first substrate 210, an interlayer insulating layer 215, a plurality of circuit elements 220a, 220b, and 220c formed on the first substrate 210, a first metal layer 230a, 230b, 230c, and 230d connected to each of the plurality of circuit elements 220a, 220b, and 220c, and a second metal layer 240a, 240b, 240c, and 240d formed on the first metal layer 230a, 230b, 230c, and 230d. In an embodiment, the first metal layer 230a, 230b, 230c, and 230d may be formed of tungsten having a relatively high resistance, and the second metal layer 240a, 240b, 240c, and 240d may be formed of copper having a relatively low resistance. However, embodiments of the present inventive concepts are not limited thereto.

In the embodiment of FIG. 1, only the first metal layer 230a, 230b, 230c, and 230d and the second metal layer 240a, 240b, 240c, and 240d are illustrated and described. However, embodiments of the present inventive concepts are not limited thereto. For example, in an embodiment, one or more additional metal layers may be further formed on the second metal layer 240a, 240b, 240c, and 240d. At least some of the one or more metal layers formed on the second metal layer 240a, 240b, 240c, and 240d may be formed of aluminum or the like having a lower resistance than copper forming the second metal layer 240a, 240b, 240c, and 240d.

The interlayer insulating layer 215 may be disposed on the first substrate 210 to cover the plurality of circuit elements 220a, 220b, and 220c, the first metal layer 230a, 230b, 230c, and 230d, and the second metal layer 240a, 240b, 240c, and 240d. In an embodiment, the interlayer insulating layer 215 may include an insulating material such as silicon oxide or silicon nitride.

As shown in the embodiment of FIG. 1, lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to upper bonding metals 371b and 372b of the cell region CELL by a bonding method. In an embodiment, the lower bonding metals 271b and 272b and the upper bonding metals 371b and 372b may be formed of aluminum, copper, tungsten, or the like. However, embodiments of the present inventive concepts are not limited thereto.

The cell region CELL may provide at least one memory block. The cell region CELL may include a second substrate 310 and a common source line 320. A plurality of word lines 331 to 338 (330) may be stacked on the second substrate 310 along a thickness direction (e.g., a "Z direction" that extends along the Z axis) that is perpendicular to the top surface of the second substrate 310. String select lines and a ground select line may be disposed above and below the word lines 330, respectively, and the plurality of word lines 330 may be disposed between the string select lines and the ground select line (e.g., in the Z direction). An insulating layer, such as an upper interlayer insulating layer may be disposed on the second substrate 310 and may contact the interlayer insulating layer 215. The upper interlayer insulating layer may extend between the word lines 330. The word lines 330 may penetrate a partial portion of the upper interlayer insulating layer (e.g., in the X direction).

In the bit line bonding area BLBA, a channel structure CH may extend substantially in the Z direction to the top surface of the second substrate 310 to penetrate the word lines 330, the string select lines, and the ground select line.

The channel structure CH may extend substantially in the vertical direction (e.g., the Z direction) as shown in the embodiments of FIGS. 2 and 3, and may include a data storage layer 397, a channel layer 390, a buried insulating layer 391, and the like. The channel layer 390 may be electrically connected to a first metal layer 350c and a second metal layer 360c which are disposed on a surface of the channel layer 390 opposite to the second substrate 310. For example, the first metal layer 350c may be a bit line contact, and the second metal layer 360c may be a bit line. In an embodiment, the bit line may extend along the second direction (e.g., a "Y direction" that extends along the Y-axis) that is parallel to the top surface of the second substrate 310.

The second substrate 310, the common source line 320, and the channel structures CH of the nonvolatile memory device 400a according to embodiments of the present inventive concepts may be formed in various shapes. Various structures of the second substrate 310 and the common source line 320, and the channel structures CH of the nonvolatile memory device 400a according to embodiments of the present inventive concepts will be illustrated in the following FIGS. 2 and 3 showing enlarged views of the area CSLR.

FIGS. 2 and 3 are various enlarged cross-sectional views for explaining the area CSLR of FIG. 1.

Referring to the embodiments of FIGS. 1 to 3, the channel layer 390 may extend in a third direction (e.g., the Z direction). Although the embodiments of FIGS. 1-3 show the channel layer 390 having a stacked cup shape, embodiments of the present inventive concepts are not limited thereto. For example, the channel layer 390 may have various shapes such as a cylindrical shape, a square tubular shape, a solid pillar shape, a single cup shape, and the like. In an embodiment, the channel layer 390 may include, a semiconductor material such as at least one compound selected from monocrystalline silicon, polycrystalline silicon, organic semiconductor material, and carbon nanostructure. However, embodiments of the present inventive concepts are not limited thereto.

The data storage layer 397 may be interposed between the channel layer 390 and the word lines 330. For example, as shown in the embodiment of FIGS. 2-3, the data storage layer 397 may extend along the side surface of the channel layer 390.

In an embodiment, the data storage layer 397 may be formed as a multilayer. For example, the data storage layer 397 may include a tunnel insulating layer 397a, a charge storage layer 397b, and a blocking insulating layer 397c sequentially stacked on the channel layer 390. In an embodiment, the tunnel insulating layer 397a may include silicon oxide or a high dielectric constant material (e.g., aluminum oxide ($Al_2O_3$) or hafnium oxide ($HfO_2$)) having a higher dielectric constant than silicon oxide. In an embodiment, the charge storage layer 397b may include silicon nitride. In an embodiment, the blocking insulating layer 397c may contain silicon oxide or a high dielectric constant material having a higher dielectric constant than that of silicon oxide. In an embodiment, the data storage layer 397 may further include a gate insulating layer 397d extending along the surfaces of the word lines 330 and contacting insulation layers 3301, such as the upper interlayer insulation layer, disposed between the word lines 330.

In an embodiment, the channel structure CH may further include the buried insulating layer 391. The buried insulating layer 391 may be formed to fill the inside of the channel layer 390 having a cup shape. In an embodiment, the buried insulating layer 391 may include insulating material, such as silicon oxide. However, embodiments of the present inventive concepts are not limited thereto.

The common source line 320 may be formed to be connected to the channel layer 390 of the channel structure CH.

As shown in the embodiment of FIG. 2, the channel structure CH may be buried in the second substrate 310 through the common source line 320. However, embodiments of the present inventive concepts are not limited thereto. The common source line 320 may be connected to the side surface of the channel layer 390 while penetrating a partial portion of the data storage layer 397.

As shown in the embodiment of FIG. 3, at least a partial portion of the common source line 320 may be buried in the second substrate 310. For example, in an embodiment, the common source line 320 may be formed from the second substrate 310 by a selective epitaxial growth (SEG) process. The channel structure CH may be connected to the top surface of the common source line 320 while penetrating a partial portion of an information storage layer 392 (FIG. 1).

Referring back to the embodiment of FIG. 1, the area where the channel structure CH, the bit line, and the like are arranged may be defined as the bit line bonding area BLBA. In the bit line bonding area BLBA, the bit line may be electrically connected to the circuit elements 220c that provide a page buffer 393 in the peripheral circuit region PERI. For example, as shown in the embodiment of FIG. 1, the bit line may be connected to an upper bonding metal 371c and 372c in the peripheral circuit region PERI, and the upper bonding metal 371c and 372c may be connected to a lower bonding metal 271c and 272c connected to the circuit elements 220c of the page buffer 393.

In the word line bonding area WLBA, the word lines 330 (331 to 337) may extend along the first direction (e.g., an "X direction" that extends along the X-axis) that is parallel to the top surface of the second substrate 310. The word lines 330 (331 to 337) may be respectively connected to a plurality of cell contact plugs 340 (341 to 347). The word lines 330 and the cell contact plugs 340 may be connected to each other in pads provided by at least some of the word lines 330 extending with different lengths along the first direction (e.g., the X direction). A first metal layer 350b and a second metal layer 360b may be sequentially connected to the top portions of the cell contact plugs 340 connected to the word lines 330. In the word line bonding area WLBA, the cell contact plugs 340 may be connected to the peripheral circuit region PERI through the upper bonding metals 371b and 372b of the cell region CELL and the lower bonding metals 271b and 272b of the peripheral circuit region PERI.

The cell contact plugs 340 may be electrically connected to the circuit elements 220b that provide a row decoder 394 in the peripheral circuit region PERI. In an embodiment, the operating voltage of the circuit elements 220b providing the row decoder 394 may be different from the operating voltage of the circuit elements 220c providing the page buffer 393. For example, in an embodiment, the operating voltage of the circuit elements 220c providing the page buffer 393 may be greater than the operating voltage of the circuit elements 220b providing the row decoder 1394. However, embodiments of the present inventive concepts are not limited thereto.

A common source line contact plug 380 may be disposed in the external pad bonding area PA. In an embodiment, the common source line contact plug 380 may be formed of a conductive material such as at least one material selected from a metal, a metal compound, or polysilicon, and may be electrically connected to the common source line 320. A first metal layer 350a and a second metal layer 360a may be sequentially stacked on the common source line contact plug 380. For example, an area in which the common source line contact plug 380, the first metal layer 350a, and the second metal layer 360a are disposed may be defined as the external pad bonding area PA.

First and second input/output pads 205 and 305 may be disposed in the external pad bonding area PA. For example, as shown in the embodiment of FIG. 1, a lower insulating layer 201 may be disposed below the first substrate 210 to cover the bottom surface of the first substrate 210, and a first input/output pad 205 may be formed on the lower insulating layer 201 (e.g., directly thereon in the Z direction). The first input/output pad 205 may be connected to at least one of the plurality of circuit elements 220a, 220b, and 220c disposed in the peripheral circuit region PERI through a first input/output contact plug 203, and may be separated from the first substrate 210 by the lower insulating layer 201. In addition, a side insulating layer may be disposed between the first input/output contact plug 203 and the first substrate 210 to electrically separate the first input/output contact plug 203 from the first substrate 210.

In an embodiment, the first substrate 210 and/or the second substrate 310 may include a base substrate and an epitaxial layer grown on the base substrate. However, embodiments of the present inventive concepts are not limited thereto and the first substrate 210 and/or the second substrate 310 may not include the base substrate and the epitaxial layer. For example, in an embodiment, the first substrate 210 and/or the second substrate 310 may include only the base substrate without the epitaxial layer. In an embodiment, the first substrate 210 and/or the second substrate 310 may be a silicon substrate, a gallium arsenide substrate, a silicon germanium substrate, a ceramic substrate, a quartz substrate, a glass substrate for a display, or a semiconductor on insulator (SOI) substrate. In the following, a silicon substrate will be described as an example of the first substrate 210 and/or the second substrate 310. However, embodiments of the present inventive concepts are not limited thereto.

In the nonvolatile memory device 400a according to an embodiment of the present inventive concepts, a process (e.g., a thinning process) of thinning at least one of the first substrate 210 or the second substrate 310 may be performed. For example, in an embodiment, the process of thinning the substrate may be performed by a chemical mechanical polishing (CMP) process. In another example, the process of thinning the substrate may be performed by a grinding process. However, embodiments of the present inventive concepts are not limited thereto and the process (e.g., a thinning process) of thinning at least one of the first substrate 210 or the second substrate 310 may be any process capable of thinning the substrate.

In the nonvolatile memory device 400a according to an embodiment of the present inventive concepts, a dummy pattern D_P may be formed in the substrate that has been subjected to the process of thinning at least one of the first substrate 210 or the second substrate 310.

For example, in an embodiment in which the process of thinning the substrate is performed on the second substrate 310, the dummy pattern D_P may be formed by filling a dummy material in a trench formed by performing an etching process from the surface where the second substrate 310 and an upper insulating layer 301 meet.

The warpage generated at the nonvolatile memory device 400a according to an embodiment of the present inventive concepts may be removed due to the dummy pattern D_P formed in the second substrate 310.

In an embodiment, the dummy material may be a material that is different from a material forming the second substrate 310. However embodiments of the present inventive concepts are not limited thereto. In an embodiment, the dummy material forming the dummy pattern D_P may be an insulating material. For example, the insulating material may be an insulating material containing a nitride material.

In an embodiment, the dummy material forming the dummy pattern D_P may be a conductive material. For example, the conductive material may be a conductive material containing tungsten (W). In an embodiment, the conductive material may be a conductive material having a low resistance. In an embodiment in which the dummy material contains a conductive material having a low resistance, the dummy pattern D_P may remove or prevent the warpage and the second substrate 310 may be relatively thinner.

Figure 4:
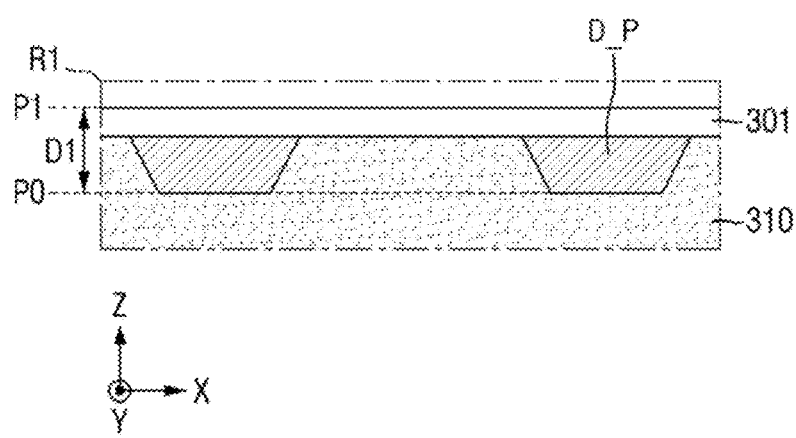
FIG. 4 is an enlarged cross-sectional view of the area R of FIG. 1 according to an embodiment of the present inventive concepts.

The dummy pattern D_P formed on the second substrate 310 will be described in detail with reference to FIG. 4 showing an enlarged view of area R.

FIG. 4 is an enlarged cross-sectional view of the area R of FIG. 1. For reference, FIG. 4 showing the area R1 is one of various enlarged cross-sectional views for embodiments of the area R.

Referring to the embodiment of FIG. 4, the dummy pattern D_P is formed in the second substrate 310. However, the number and the shape of dummy patterns D_P formed in the second substrate 310 are not limited to those shown in the embodiment of FIG. 4, and the number and the shape of the dummy patterns D_P formed in the second substrate 310 may vary.

A lowermost end P0 of the dummy pattern DP according to an embodiment of the present inventive concepts may be separated from an uppermost end P1 of the upper insulating layer 301 by a first distance D1. As shown in the embodiment of FIG. 4, the first distance D1 may a length in the Z direction. In an embodiment, the first distance D1 may be in a range of about 100 nanometers to about 200 nanometers. However, embodiments of the present inventive concepts are not limited thereto and the size of the first distance D may vary. For example, in an embodiment, the first distance D1 may be about 50 nanometers.

Figure 5:
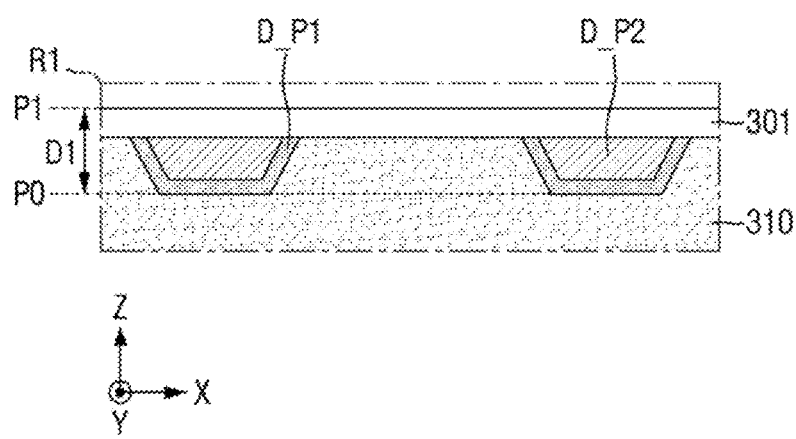
FIG. 5 is another enlarged cross-sectional view of the area R of FIG. 1 according to an embodiment of the present inventive concepts.

FIG. 5 is another enlarged cross-sectional view of the area R of FIG. 1. For reference, FIG. 5 showing area R1 is one of various enlarged cross-sectional views for embodiments of the area R.

Referring to the embodiment of FIG. 5, unlike the dummy pattern of the embodiment of FIG. 4, the dummy pattern of the embodiment of FIG. 5 may be made of a composite film containing a plurality of materials. For example, the dummy pattern may include a first dummy pattern D_P1 and a second dummy pattern D_P2. However, embodiments of the present inventive concepts are not limited thereto and the number of dummy patterns forming the dummy pattern may vary. For example, in an embodiment, the dummy pattern may further include a third dummy pattern, a fourth dummy pattern, etc.

For example, in an embodiment in which the dummy pattern is composed of an insulating material, the first dummy pattern D_P1 may be made of nitride and the second dummy pattern D_P2 may be made of oxide. However, embodiments of the present inventive concepts are not limited thereto and the materials forming the first dummy pattern D_P1 and the second dummy pattern D_P2 may vary.

In an embodiment in which the dummy pattern is made of a conductive material, the first dummy pattern D_P1 may be made of tungsten (W) and the second dummy pattern D_P2 may be made of aluminum (Al). However, embodiments of the present inventive concepts are not limited thereto and the materials forming the first dummy pattern D_P1 and the second dummy pattern D_P2 may vary.

As shown in the embodiment of FIG. 5, a lowermost end P0 of the first dummy pattern D_P1 may be separated from an uppermost end P1 of the upper insulating layer 301 by the first distance D1. In an embodiment, the first distance D1 may be in a range of about 100 nanometers to about 200 nanometers. However, embodiments of the present inventive concepts are not limited thereto and the first distance D1 may vary. For example, in an embodiment, the first distance D1 may be about 50 nanometers.

As shown in the embodiment of FIG. 5, the lowermost end of the second dummy pattern D_P2 may be higher than the lowermost end of the first dummy pattern D_P1 in the third direction (e.g., the Z direction).

A method for forming a dummy pattern D_P in a nonvolatile memory device according to embodiments of the present inventive concepts will be illustrated with reference to FIGS. 6 to 8. Hereinafter, a repeated description of similar or identical elements as in the embodiments described above will be omitted for convenience of explanation.

Figure 6:
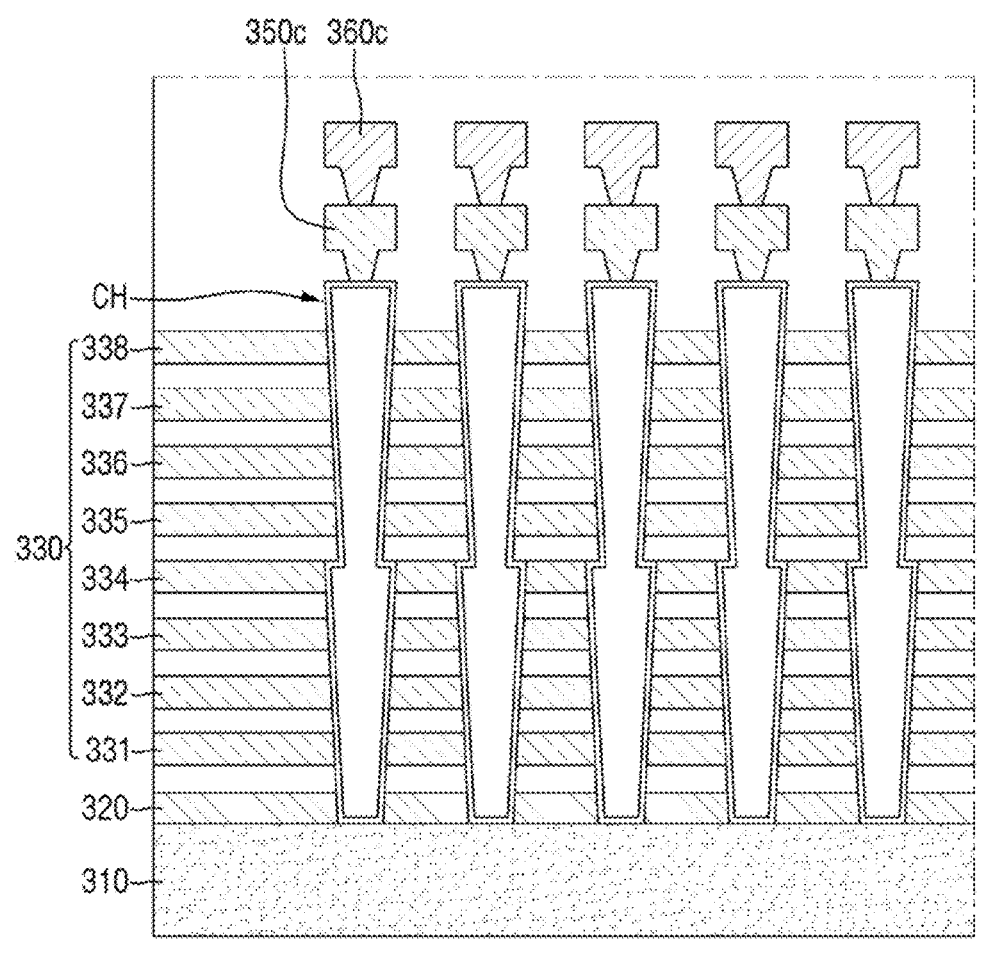
FIGS. 6 to 8 are cross-sectional views illustrating the intermediate steps of a method for fabricating a nonvolatile memory device for forming a dummy pattern according to embodiments of the present inventive concepts.
Figure 7:
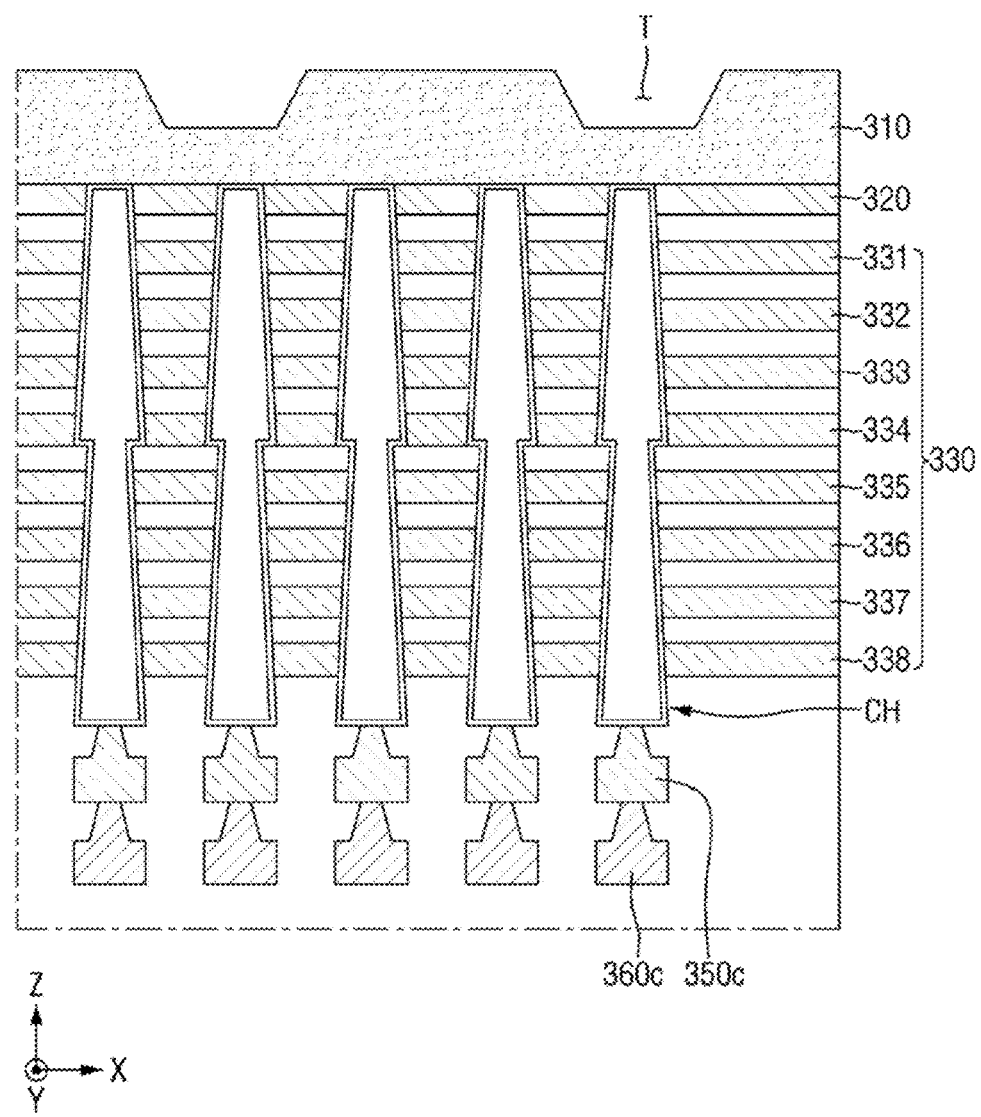
Figure 8:
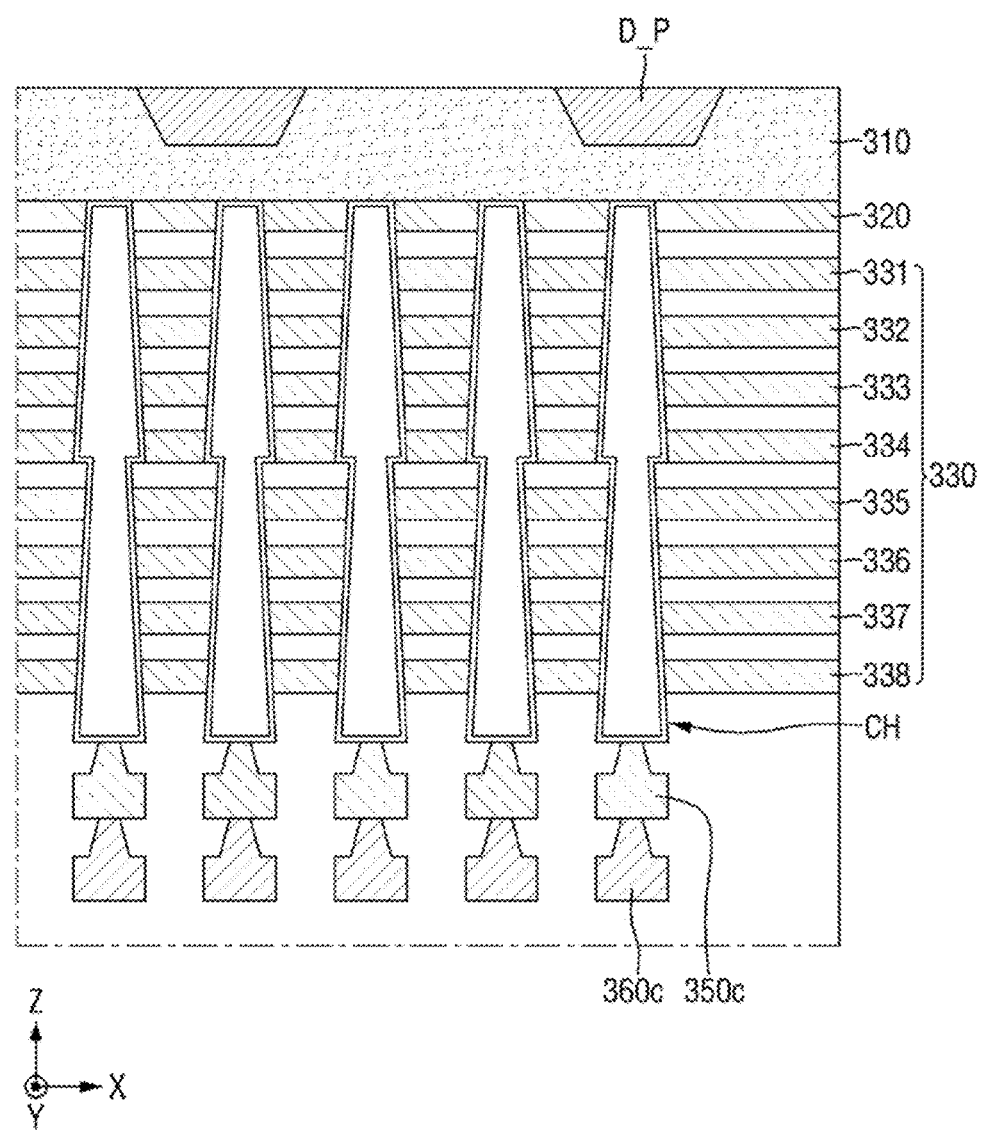

FIGS. 6 to 8 are diagrams illustrating the intermediate steps of a method for fabricating a nonvolatile memory device for forming a dummy pattern according to embodiments of the present inventive concepts. For reference, a part of the nonvolatile memory device according to embodiments of the present inventive concepts will be described as an example for simplicity of description.

First, referring to the embodiment of FIG. 6, the common source line 320, the word lines 330 (331-338), and the insulating layer are alternately stacked on the second substrate 310 in the third direction (e.g., the Z direction). The channel structure CH extending in the third direction (e.g., the Z direction) is formed to penetrate through the common source line 320, the word lines 330, and the insulating layer. The first metal layer 350c and the second metal layer 360c electrically connected to the channel structure CH are then formed sequentially.

Referring to the embodiment of FIG. 7, a trench T is formed from the lowermost end of the second substrate 310 in the third direction (e.g., the Z direction) by etching.

Referring to the embodiment of FIG. 8, the trench T in FIG. 7 is filled with a dummy material to form the dummy pattern D_P. In an embodiment, the nonvolatile memory device 400a may then be fabricated by forming the upper insulating layer 301 on the dummy pattern D_P and the second substrate 310.

Figure 9:
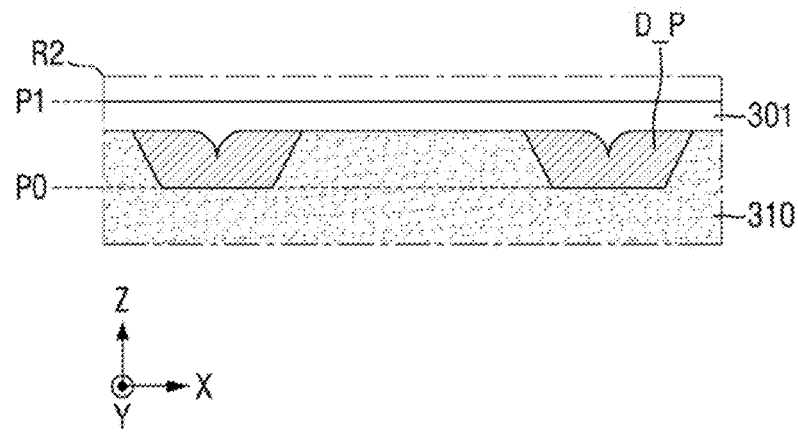
FIGS. 9 to 11 show enlarged cross-sectional views of the area R of FIG. 1 according to embodiments of the present inventive concepts.
Figure 10:
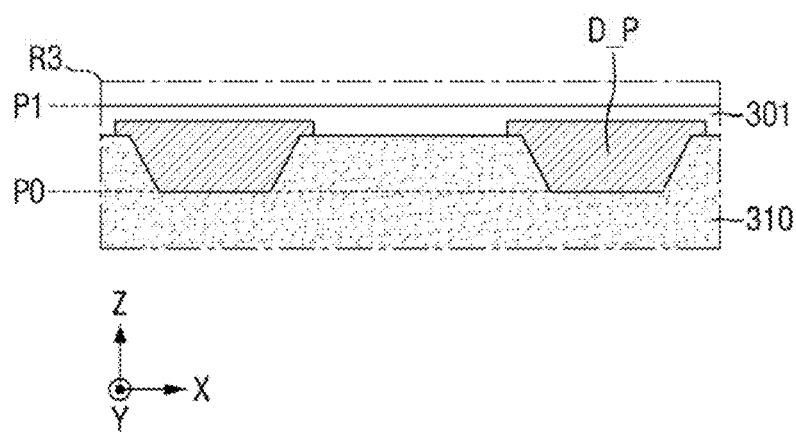
Figure 11:
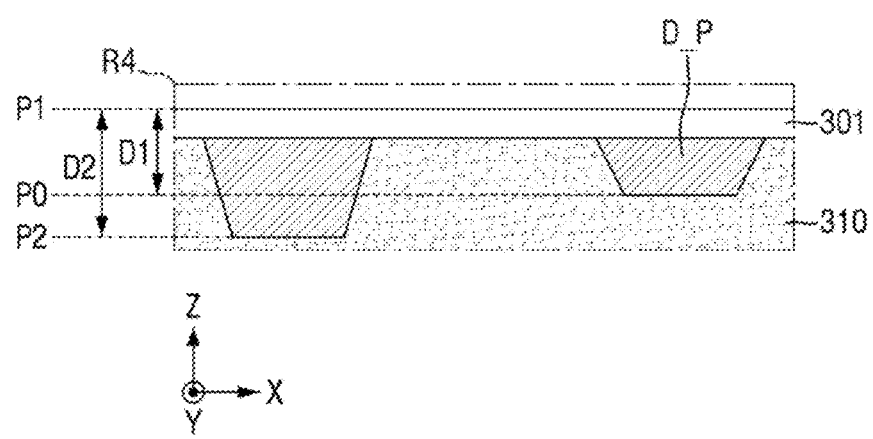

FIGS. 9 to 11 show other enlarged cross-sectional views of the area R of FIG. 1. For reference, each of FIG. 9 showing area R2, FIG. 10 showing area R3, and FIG. 11 showing area R4 is one of various exemplary enlarged cross-sectional views for embodiments of the area R of FIG. 1.

Referring to the embodiment of FIG. 9, in the process of filling the trench T of FIG. 7 with the dummy material, the trench T may not be completely filled with the dummy material. In this embodiment, the dummy pattern D_P according to may have a shape in which the upper insulating layer 301 has penetrated the dummy pattern D_P. For example, as shown in the embodiment of FIG. 9, the upper insulating layer 301 partially penetrates the dummy pattern D_P (e.g., in the Z direction).

As shown in the embodiment of FIG. 10, in the process of filling the trench T of FIG. 7 with the dummy material, the dummy material may overfill the trench T so that the dummy material extends over the surface where the second substrate 310 and the upper insulating layer 301 meet. In this embodiment, the dummy pattern D_P may have a shape in which the dummy pattern DP has penetrated the upper insulating layer 301.

As shown in the embodiment of FIG. 11, the plurality of dummy patterns D_P may have shapes in which the depths of the lowermost ends thereof are different from each other. For example, one dummy pattern D_P of the plurality of dummy patterns D_P may be formed such that a lowermost end P2 thereof is separated from an uppermost end P1 of the upper insulating layer 301 by a distance of a second length D2 (e.g., a length in the Z direction).

Further, another dummy pattern D_P may be formed such that a lowermost end P1 thereof is separated from the uppermost end P1 of the upper insulating layer 301 by a distance of a first length D1 (e.g., a length in the Z direction).

For example, a plurality of dummy patterns D_P having different shapes may be included in the second substrate 310.

FIGS. 12 to 15 are perspective views of a nonvolatile memory device according to embodiments of the present inventive concepts.

Figure 12:
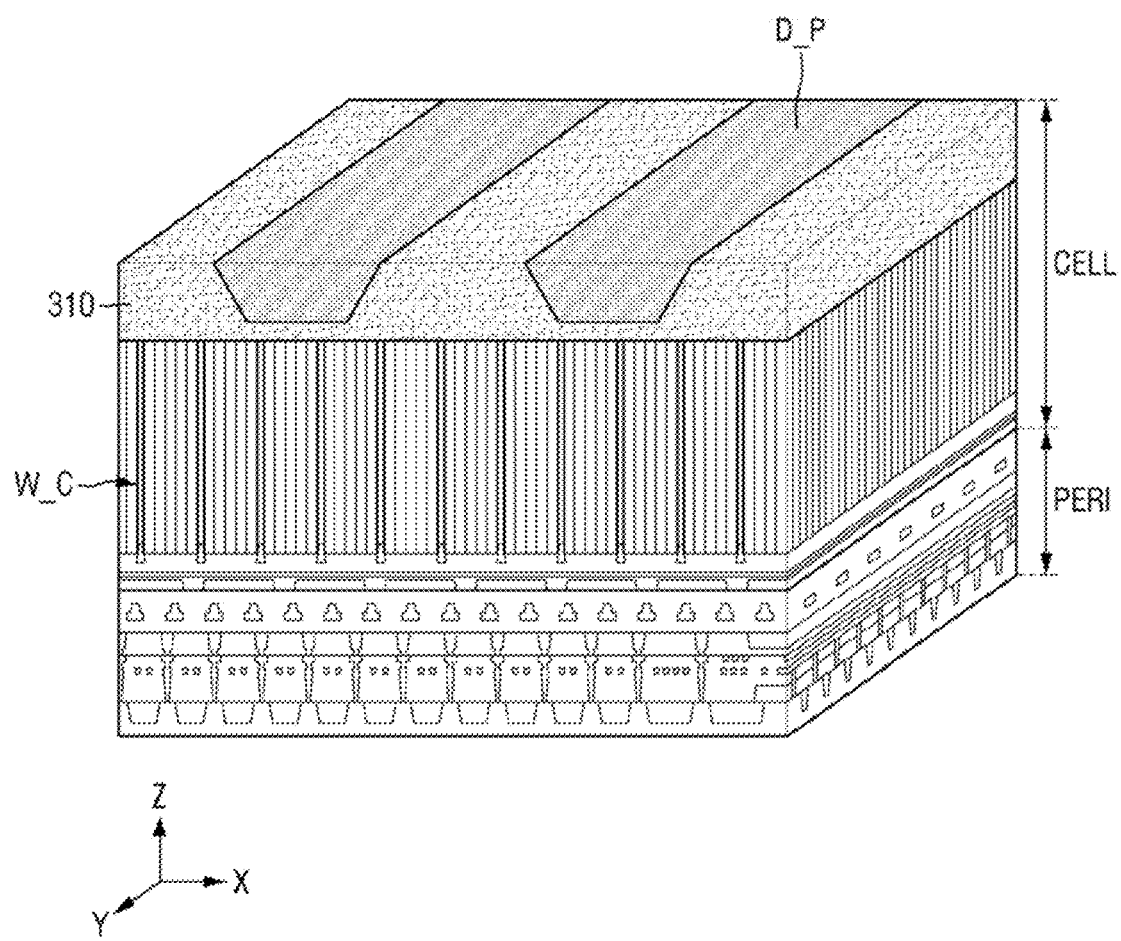
FIGS. 12 to 15 are perspective views of a nonvolatile memory device according to embodiments of the present inventive concepts.

Referring to the embodiment of FIG. 12, a dummy pattern D_P of a nonvolatile memory device may extend longitudinally in the second direction (e.g., the Y direction) in which a word line cut W_C extends. However, embodiments of the present inventive concepts are not limited thereto. For example, in an embodiment, the dummy pattern D_P may extend in the second direction (e.g., the Y direction) and may intersect bit lines. In an embodiment, the dummy pattern D_P may extend in the second direction (e.g., the Y direction) intersecting the direction in which the plurality of word lines extend.

Figure 13:
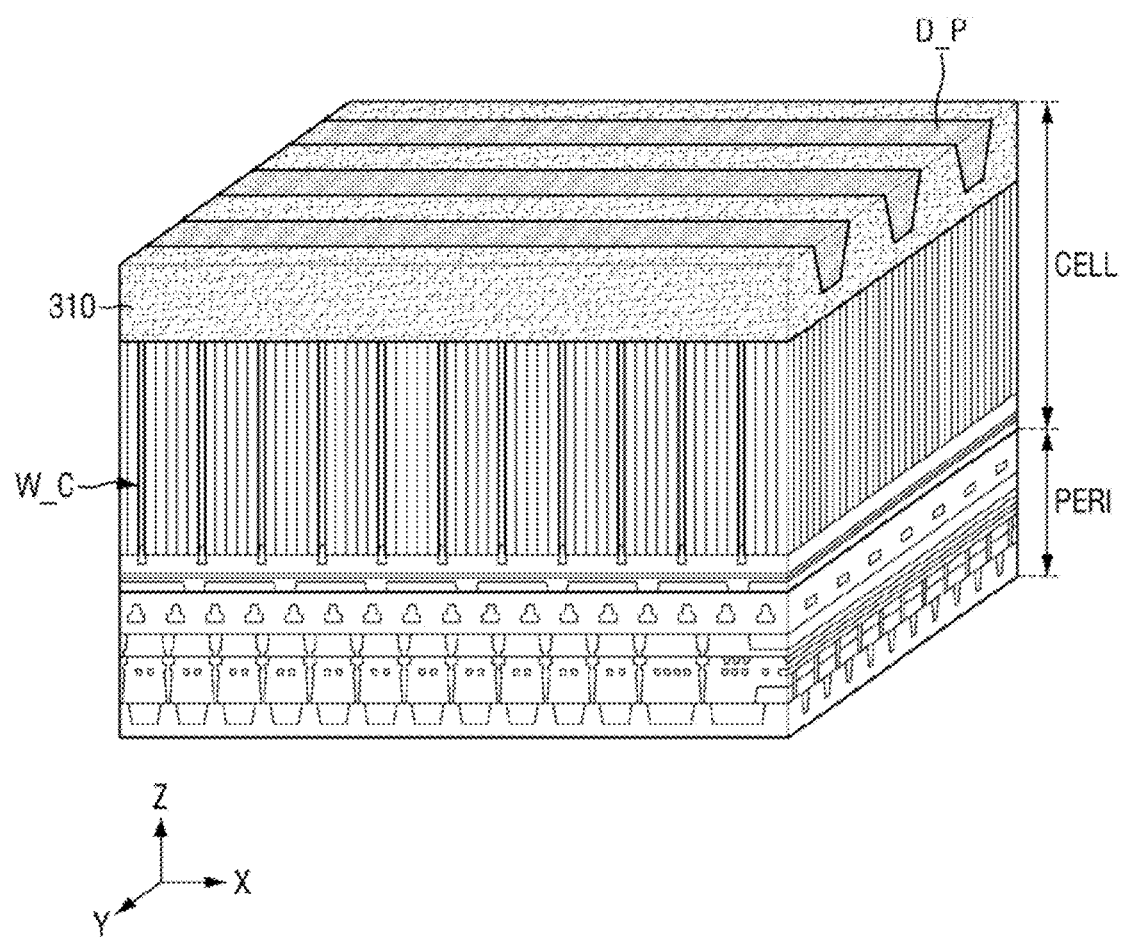

Referring to the embodiment of FIG. 13, a dummy pattern D_P of a nonvolatile memory device may extend in the first direction (e.g., the X direction) intersecting the direction in which the word line cut W_C extends. In an embodiment, the dummy pattern D_P may extend in the first direction (e.g., the X direction) in which the bit lines extend. However, embodiments of the present inventive concepts are not limited thereto. For example, in an embodiment, the dummy pattern D_P may extend in the first direction (e.g., the X direction) in which the plurality of word lines extend.

Figure 14:
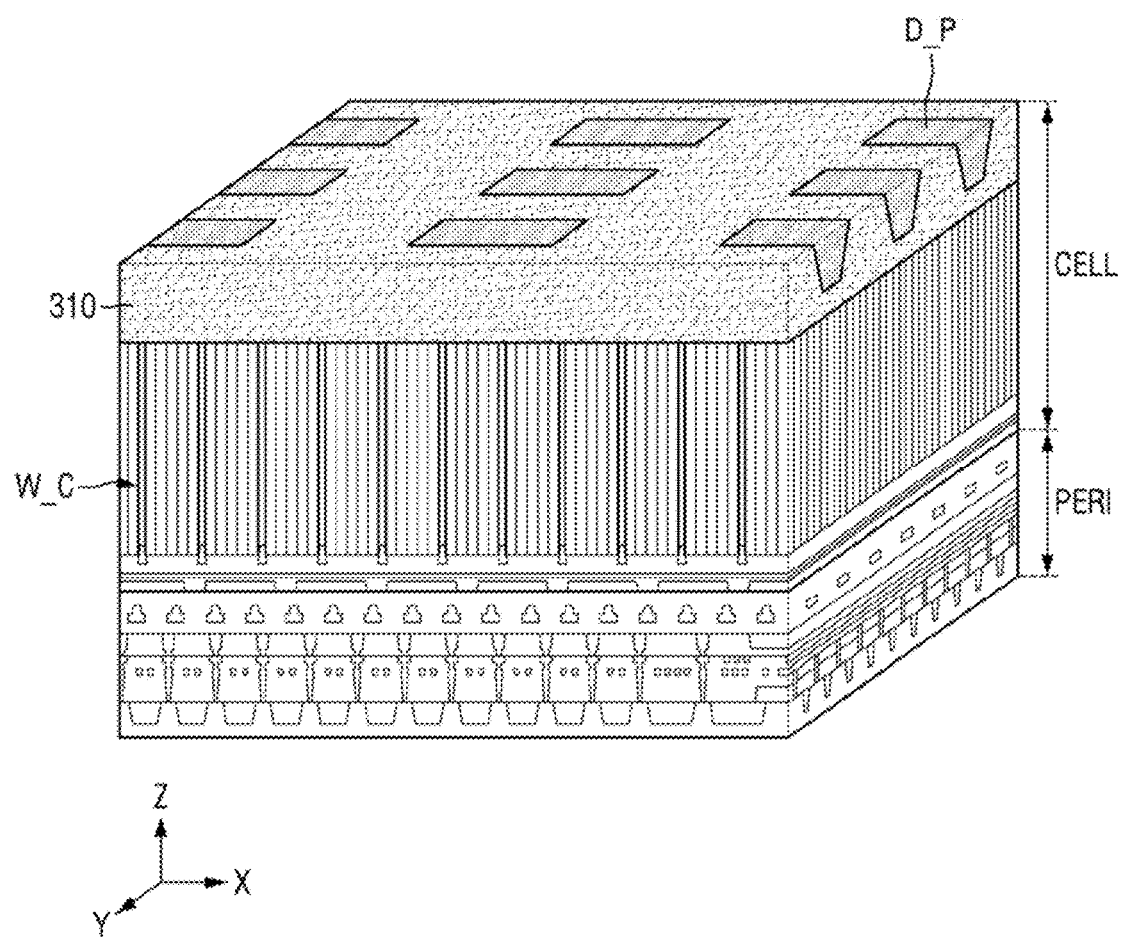

Referring to the embodiment of FIG. 14, a dummy pattern D_P of a nonvolatile memory device may have a discontinuous shape. For example, a plurality of dummy patterns D_P may be disposed in the first substrate 210 and each of the plurality of dummy patterns D_P may be discrete from each other.

Figure 15:
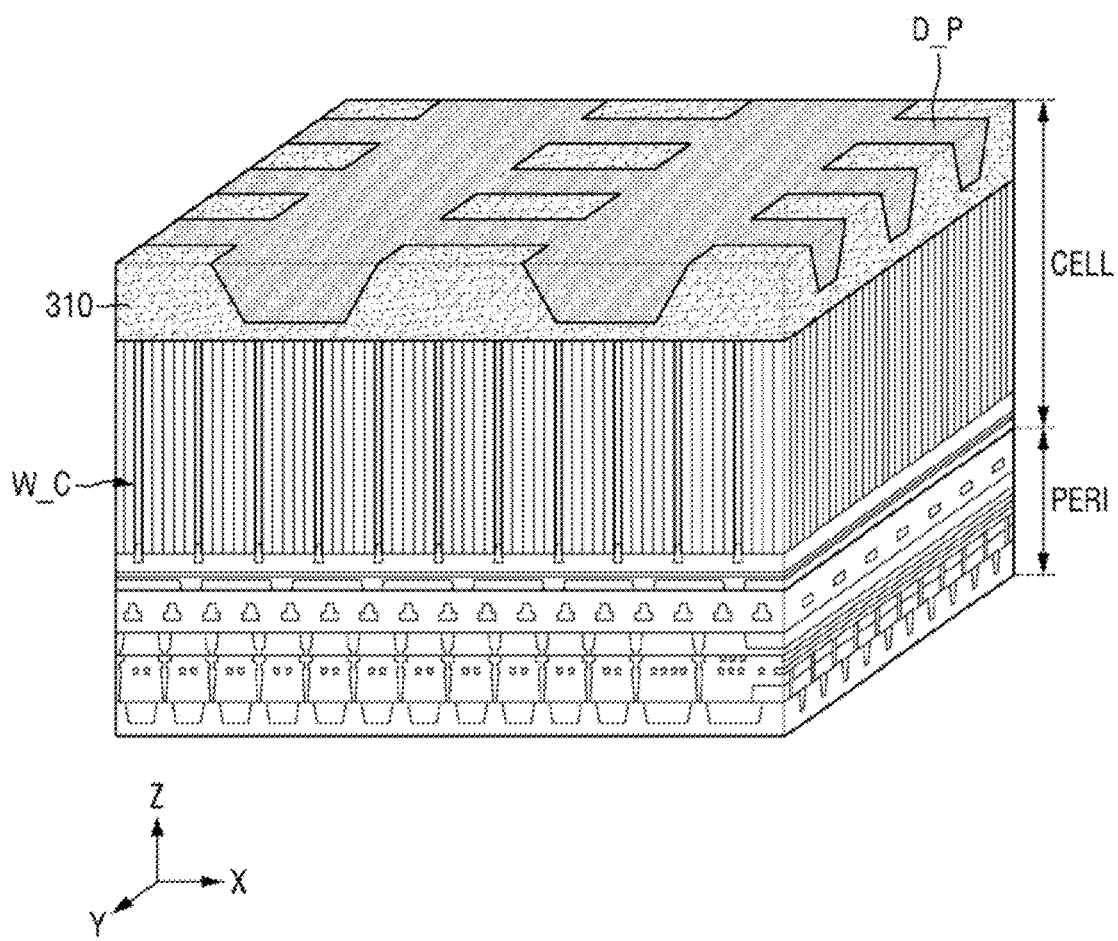

Referring to FIG. 15, a dummy pattern D_P of a nonvolatile memory device according to some embodiments may have a shape extending in both the first direction (e.g., the X direction) and the second direction (e.g., the Y direction).

However, embodiments of the present inventive concepts are not limited thereto and the direction and shape of the dummy pattern D_P may be formed in any direction and may be any shape for removing warpage of a nonvolatile memory device.

Figure 16:
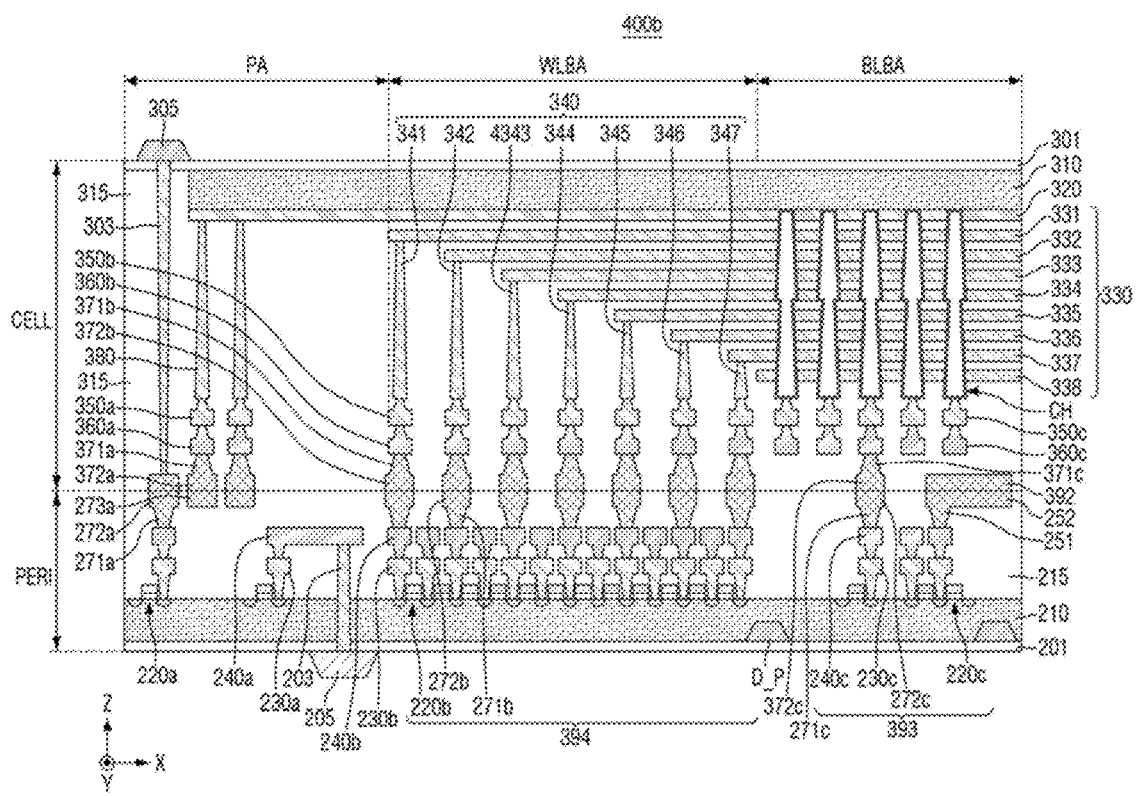
FIGS. 16 to 17 are cross-sectional views of nonvolatile memory devices according to embodiments of the present inventive concepts.
Figure 17:
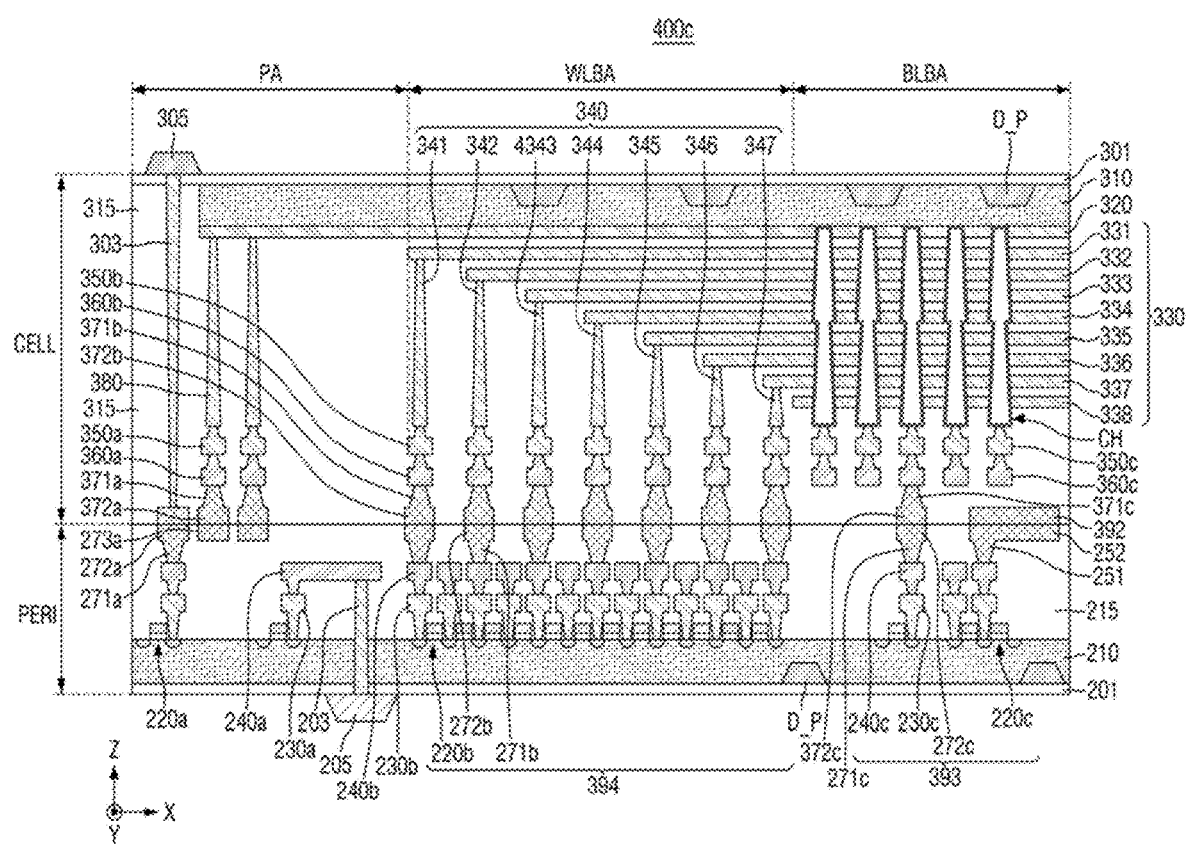

FIGS. 16 to 17 are cross-sectional views of other nonvolatile memory devices according to embodiments of the present inventive concepts.

Referring to the embodiment of FIG. 16, a nonvolatile memory device 400b is different from the nonvolatile memory device 400a according to the embodiments of FIG. 1 in that the dummy pattern D_P is formed only at the first substrate 210 and is not formed in the second substrate 310.

In the nonvolatile memory device 400b according to an embodiment of the present inventive concepts, a process (e.g., a thinning process) of thinning at least one of the first substrate 210 or the second substrate 310 may be performed. In an embodiment, the process of thinning the substrate may be performed by a chemical mechanical polishing (CMP) process. In an embodiment, the process of thinning the substrate may be performed by a grinding process. However, embodiments of the present inventive concepts are not limited thereto. For example, the process (e.g., a thinning process) of thinning at least one of the first substrate 210 or the second substrate 310 is not limited to the above-described processes, and may be any process capable of thinning the substrate.

In the nonvolatile memory device 400b according to an embodiment of the present inventive concepts, a dummy pattern DP may be formed in the substrate that has been subjected to the process of thinning at least one of the first substrate 210 or the second substrate 310.

For example, when the process of thinning the substrate is performed on the first substrate 210, the dummy pattern D_P may be formed by filling a dummy material in a trench formed by performing an etching process from the surface where the first substrate 210 and a lower insulating layer 201 meet.

The warpage generated at the nonvolatile memory device 400b according to an embodiment of the present inventive concepts may be removed due to the dummy pattern D_P formed in the first substrate 210.

In an embodiment, the dummy material may be a material that is different from a material forming the first substrate 210. In an embodiment, the dummy material forming the dummy pattern D_P may be an insulating material. For example, the insulating material may be an insulating material containing a nitride material. However, embodiments of the present inventive concepts are not limited thereto. For example, the dummy material forming the dummy pattern D_P may be a conductive material. In an embodiment, the conductive material may be tungsten (W). In an embodiment, the conductive material may be a conductive material having a low resistance. In an embodiment in which the dummy material is a conductive material having a low resistance, the dummy pattern D_P may remove or prevent the warpage and the first substrate 210 may be relatively thin.

Referring to the embodiment of FIG. 17, a nonvolatile memory device 400c is different from the nonvolatile memory device 400a according to the embodiment of FIG. 1 in that the dummy pattern D_P is formed at both the second substrate 310 and the first substrate 210. Since the dummy pattern D_P formed at the second substrate 310 is similar to the dummy pattern D_P formed at the first substrate 210, a repeated description thereof will be omitted for convenience of explanation.

Figure 18:
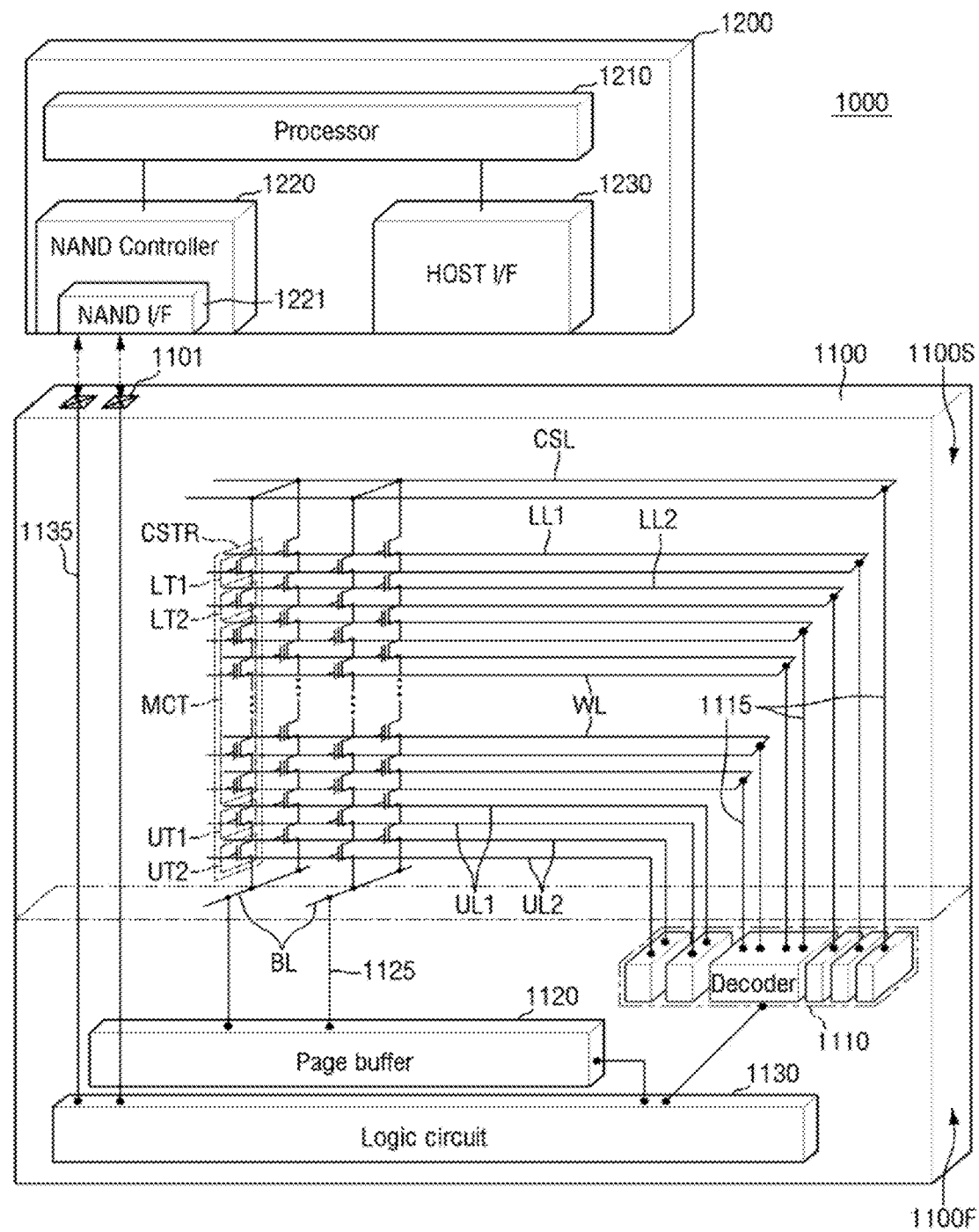
FIG. 18 is a block diagram illustrating a nonvolatile memory system including a nonvolatile memory device according to an embodiment of the present inventive concepts

FIG. 18 is an exemplary block diagram illustrating a nonvolatile memory system including a nonvolatile memory device according to an embodiment of the present inventive concepts.

Referring to FIG. 18, a nonvolatile memory system 1000 according to an embodiment of the present inventive concepts may include a semiconductor device 1100 and a controller 1200 electrically connected to the semiconductor device 1100. In an embodiment, the nonvolatile memory system 1000 may be a storage device including one or a plurality of semiconductor devices 1100, or an electronic device including the storage device. For example, in an embodiment, the nonvolatile memory system 1000 may be a solid state drive device (SSD) including one or a plurality of semiconductor devices 1100, a universal serial bus (USB), a computing system, a medical device, or a communication device.

In an embodiment, the semiconductor device 1100 may be a nonvolatile memory device, such as a NAND flash memory device described with reference to the embodiments of FIGS. 1 to 17. The semiconductor device 1100 may include a first structure 1100F and a second structure 1100S disposed on the first structure 1100F. The first structure 1100F may be disposed next to the second structure 1100S. As shown in the embodiment of FIG. 18, the first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR disposed between the bit line BL and the common source line CSL.

In the second structure 1100S, each of the memory cell strings CSTR may include first and second lower transistors LT1 and LT2 adjacent to the common source line CSL, first and second upper transistors UT1 and UT2 adjacent to the bit line BL, and a plurality of memory cell transistors MCT disposed between the first and second lower transistors LT1 and LT2 and the upper transistors UT1 and UT2. While the embodiment of FIG. 18 includes first and second lower transistors LT1, LT2 and first and second upper transistors UT1, UT2, embodiments of the present inventive concepts are not limited thereto and the number of the lower transistors and the number of the upper transistors may vary.

In an embodiment, the first and second upper transistors UT1 and UT2 may include a string select transistor, and the first and second lower transistors LT1 and LT2 may include a ground select transistor. The first and second gate lower lines LL1 and LL2 may be the gate electrodes of the lower transistors LT1 and LT2, respectively. The word lines WL may be the gate electrodes of the memory cell transistors MCT, and the first and second gate upper lines UL1 and UL2 may be the gate electrodes of the first and second upper transistors UT1 and UT2, respectively.

In an embodiment, the first and second lower transistors LT1 and LT2 may include a lower erase control transistors and a ground select transistor respectively connected in series. The first and second upper transistor UT1 and UT2 may include a string select transistor and an upper erase control transistor connected in series. In an embodiment, at least one of the lower erase control transistor or the upper erase control transistor may be used for an erase operation of erasing data stored in the memory cell transistors MCT using a gate induce drain leakage (GIDL) phenomenon.

In an embodiment, the common source line CSL, the first and second gate lower lines LL1 and LL2, the word lines WL, and the first and second gate upper lines UL1 and UL2 may be electrically connected to the decoder circuit 1110 through first connection lines 1115 extending to the second structure 1100S in the first structure 1100F. The bit lines BL may be electrically connected to the page buffer 1120 through second connection lines 1125 extending to the second structure 1100S in the first structure 1100F.

In the first structure 1100F, the decoder circuit 1110 and the page buffer 1120 may control at least one of the plurality of memory cell transistors MCT. The decoder circuit 1110 and the page buffer 1120 may be controlled by the logic circuit 1130. As shown in the embodiment of FIG. 18, the semiconductor device 1100 may communicate with the controller 1200 through an input/output pad 1101 electrically connected to the logic circuit 1130. The input/output pad 1101 may be electrically connected to the logic circuit 1130 through an input/output connection line 1135 extending to the second structure 1100S in the first structure 1100F.

The controller 1200 may include a processor 1210, a NAND controller 1220, and a host interface 1230. In an embodiment, the nonvolatile memory system 1000 may include a plurality of semiconductor devices 1100. In this embodiment, the controller 1200 may control each of the plurality of semiconductor devices 1000.

In an embodiment, the processor 1210 may control the overall operation of the nonvolatile memory system 1000 including the controller 1200. The processor 1210 may operate based on a predetermined firmware and may access the semiconductor device 1100 by controlling the NAND controller 1220. The NAND controller 1220 may include a NAND interface 1221 that communicates with the semiconductor device 1100. A control command for controlling the semiconductor device 1100, data to be recorded in the memory cell transistors MCT of the semiconductor device 1100, and data to be read out from the memory cell transistors MCT of the semiconductor device 1100, or the like may be transmitted through the NAND interface 1221. The host interface 1230 may provide a communication function between the nonvolatile memory system 1000 and an external host. In an embodiment, when the control command from the external host is received through the host interface 1230, the processor 1210 may control the semiconductor device 1100 in response to the control command.

Figure 19:
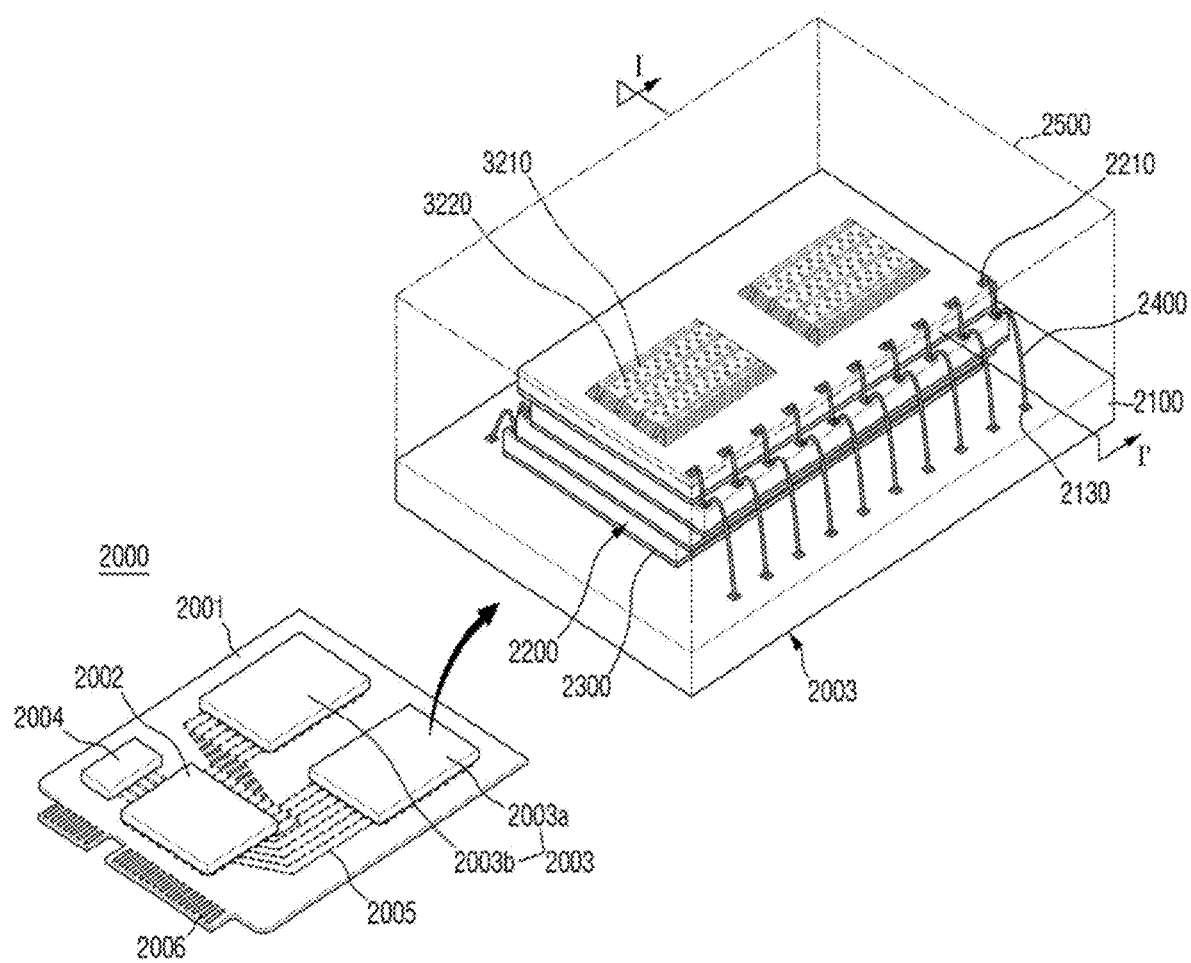
FIG. 19 is an perspective view illustrating a nonvolatile memory system including a nonvolatile memory device according to an embodiment of the present inventive concepts.

FIG. 19 is a perspective view illustrating a nonvolatile memory system including a nonvolatile memory device according to an embodiment of the present inventive concepts.

Referring to the embodiment of FIG. 19, a nonvolatile memory system 2000 may include a main substrate 2001, a controller 2002 mounted on the main substrate 2001, one or more nonvolatile memory packages 2003 (2003a, 2003b), and a DRAM 2004. The nonvolatile memory package 2003 and the DRAM 2004 may be connected to the controller 2002 by wiring patterns 2005 formed on the main substrate 2001.

As shown in the embodiment of FIG. 19, the main substrate 2001 may include a connector 2006 having a plurality of pins connected to the external host. In the connector 2006, the number and the arrangement of the plurality of pins may vary depending on a communication interface between the nonvolatile memory system 2000 and the external host. In an embodiment, the nonvolatile memory system 2000 may communicate with the external host through any one of interfaces such as universal serial bus (USB), peripheral component interconnect express (PCI-Express), serial advanced technology attachment (SATA), M-Phy for universal flash storage (UFS), and the like. In an embodiment, the nonvolatile memory system 2000 may operate by a power supplied from the external host through the connector 2006. The nonvolatile memory system 2000 may further include a power management integrated circuit (PMIC) for distributing the power supplied from the external host to the controller 2002 and the nonvolatile memory package 2003.

In an embodiment, the controller 2002 may record data in the nonvolatile memory package 2003, read out data from the nonvolatile memory package 2003, and may increase the operation speed of the nonvolatile memory system 2000.

The DRAM 2004 may be a buffer memory for reducing the speed difference between the nonvolatile memory package 2003 that is a data storage area and the external host. In an embodiment, the DRAM 2004 included in the nonvolatile memory system 2000 may operate as a cache memory, and may provide a space for temporarily storing data in controlling the nonvolatile memory package 2003. In embodiments in which the DRAM 2004 is included in the nonvolatile memory system 2000, the controller 2002 may further include a DRAM controller for controlling the DRAM 2004 in addition to the NAND controller for controlling the nonvolatile memory package 2003.

As shown in the embodiment of FIG. 19, the nonvolatile memory package 2003 may include a first nonvolatile memory package 2003a and a second nonvolatile memory package 2003b that are separated from each other. As shown in the embodiment of FIG. 19, each of the first and the second nonvolatile memory packages 2003a and 2003b may be a nonvolatile memory package including a plurality of semiconductor chips 2200 which may be stacked on each other (e.g., in a vertical direction). Each of the first and the second nonvolatile memory packages 2003a and 2003b may include a package substrate 2100, semiconductor chips 2200 formed on the package substrate 2100, adhesive layers 2300 formed on the bottom surfaces of the semiconductor chips 2200, a connection structure 2400 for electrically connecting the semiconductor chips 2200 and the package substrate 2100, and a molding layer 2500 covering the semiconductor chips 2200 and the connection structure 2400 on the package substrate 2100.

As shown in the embodiment of FIG. 19, the package substrate 2100 may be a printed circuit board including package upper pads 2130. Each of the semiconductor chips 2200 may include an input/output pad 2210. The input/output pad 2210 may correspond to the input/output pad 1101 shown in the embodiment of FIG. 18. Each of the semiconductor chips 2200 may include word lines 3210 and channel structures 3220 penetrating the word lines 3210 (e.g., in a vertical direction). Each of the semiconductor chips 2200 may include the semiconductor device described with reference to the embodiments of FIGS. 1 to 17.

In an embodiment, the connection structure 2400 may be a bonding wire that electrically connects the input/output pad 2210 and the package upper pads 2130. Therefore, in each of the first and the second nonvolatile memory packages 2003a and 2003b, the semiconductor chips 2200 may be electrically connected to each other by a bonding wire method, and may be electrically connected to the package upper pads 2130 of the package substrate 2100. However, embodiments of the present inventive concepts are not limited thereto. For example, in an embodiment, in each of the first and the second nonvolatile memory packages 2003a and 2003b, the semiconductor chips 2200 may be electrically connected to each other by a connection structure including a through silicon via (TSV), instead of the bonding wire type connection structure 2400.

In an embodiment, the controller 2002 and the semiconductor chips 2200 may be included in one package. For example, the controller 2002 and the semiconductor chips 2200 may be mounted on a separate interposer substrate that is different from the main substrate 2001, and connected to each other by a wiring formed on the interposer substrate. However, embodiments of the present inventive concepts are not limited thereto.

Figure 20:
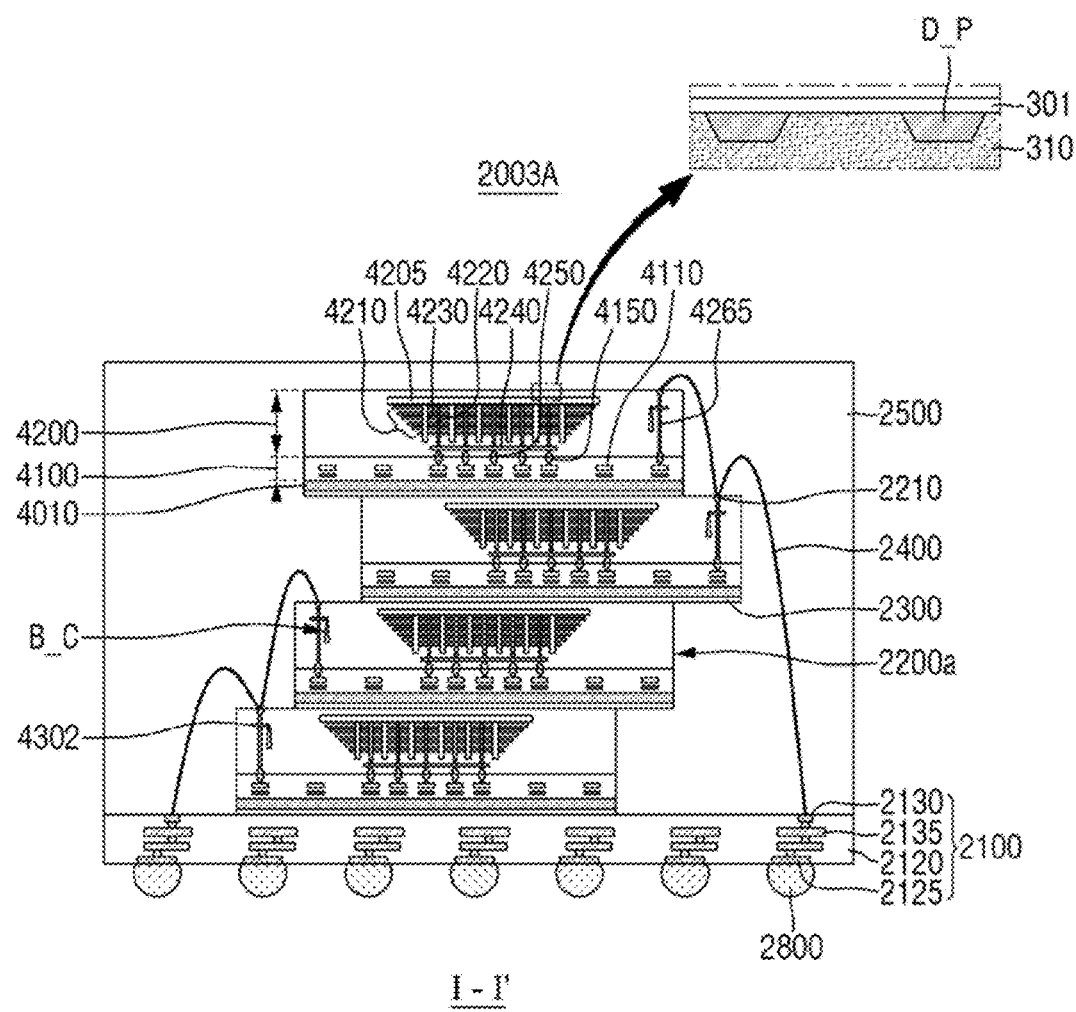
FIGS. 20 and 21 are enlarged cross-sectional views and cross-sectional views taken along line I-I' of FIG. 19 of nonvolatile memory packages including the nonvolatile memory device according to embodiments of the present inventive concepts.
Figure 21:
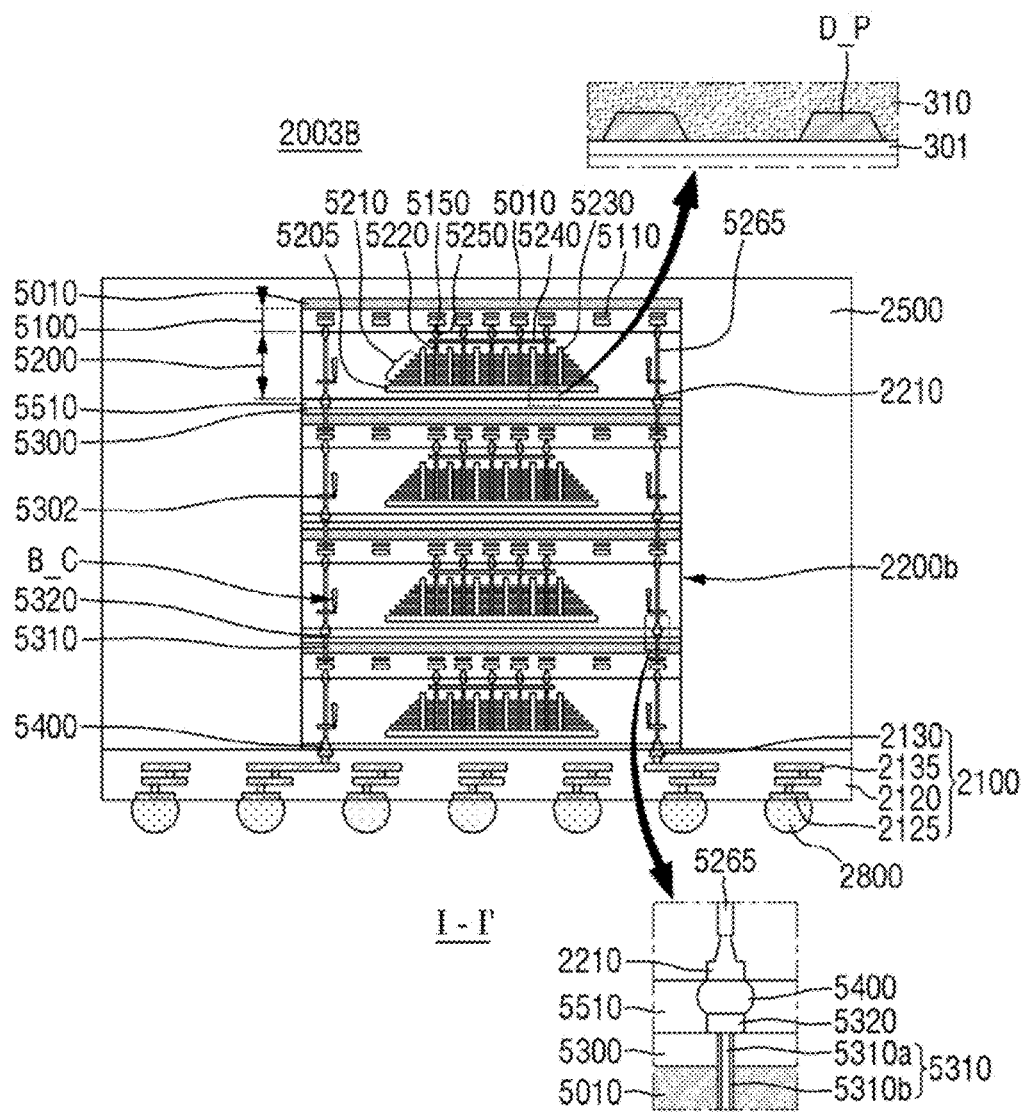

FIGS. 20 and 21 are cross-sectional views of the nonvolatile memory package of FIG. 19 including the nonvolatile memory device according to embodiments of the present inventive concepts, which are taken along line I-I'.

Referring to the embodiment of FIG. 20, in a nonvolatile memory package 2003A, each of a plurality of semiconductor chips 2200a may include a semiconductor substrate 4010, a first structure 4100 formed on the semiconductor substrate 4010, and a second structure 4200 bonded to the first structure 4100 by a wafer bonding method on the first structure 4100.

In an embodiment, the first structure 4100 may include a peripheral circuit region including a peripheral wiring 4110 and first bonding structures 4150. The second structure 4200 may include a common source line 4205, word lines 4210 disposed between the common source line 4205 and the first structure 4100, channel structures 4220 and an isolation structure 4230 penetrating the word lines 4210 (e.g., in a vertical direction), second bonding structures 4250 electrically connected to the channel structures 4220 and the word lines 4210 corresponding to the word lines WL of the embodiment of FIG. 18. For example, as shown in the embodiment of FIG. 20, the second bonding structures 4250 may be electrically connected to the channel structures 4220 and the word lines 4210 corresponding to the word lines WL of FIG. 18 through bit lines 4240 electrically connected to the channel structures 4220 and the first connection lines 1115 (see FIG. 18) electrically connected to the word lines WL (see FIG. 18). In an embodiment, the first bonding structures 4150 of the first structure 4100 and the second bonding structures 4250 of the second structure 4200 may be bonded while being in direct contact with each other. In an embodiment, the bonding portions between the first bonding structures 4150 and the second bonding structures 4250 may be made of copper (Cu). However, embodiments of the present inventive concepts are not limited thereto.

In an embodiment, the semiconductor chips 2200a including the nonvolatile memory device may further include the dummy pattern D_P in the substrate to remove or prevent warpage.

As shown in the embodiment of FIG. 20, the semiconductor chips 2200a of the embodiment of FIG. 20 may be electrically connected to each other by the bonding wire type connection structures 2400. However, embodiments of the present inventive concepts are not limited thereto. For example, the semiconductor chips in one nonvolatile memory package, such as the semiconductor chips 2200a of FIG. 20, may be electrically connected to each other by a connection structure including a through silicon via (TSV).

Referring to the embodiment of FIG. 21, in a semiconductor package 2003B, semiconductor chips 2200b may be aligned vertically. For example, the lateral edges of the semiconductor packages 2003B may be aligned in the vertical direction. As shown in the embodiment of FIG. 21, each of the semiconductor chips 2200b may include a semiconductor substrate 5010, a first structure 5100 formed below the semiconductor substrate 5010, and a second structure 5200 bonded to the first structure 5100 below the first structure 5100 by a wafer bonding method.

The first structure 5100 may include a peripheral circuit region including a peripheral wiring 5110 and first bonding structures 5150. The second structure 5200 may include a common source line 5205, word lines 5210 formed between the common source line 5205 and the first structure 5100, channel structures 5220 and isolation structures 5230 penetrating the word lines 5210 (e.g., in a vertical direction), and second bonding structures 5250 electrically connected to the channel structures 5220 and the word lines 5210 corresponding to the word lines WL (see FIG. 18). For example, the second bonding structures 5250 may be electrically connected to the channel structures 5220 and the word lines 5210 corresponding to the word lines WL of FIG. 18 through the bit lines 5240 electrically connected to the channel structures 5220 and the first connection lines 1115 (see FIG. 18) electrically connected to the word lines WL (see FIG. 18). In an embodiment, the first bonding structures 5150 of the first structure 5100 and the second bonding structures 5250 of the second structure 5200 may be bonded while being in direct contact with each other. In an embodiment, the bonding portions between the first bonding structures 5150 and the second bonding structures 5250 may be made of copper (Cu). However, embodiments of the present inventive concepts are not limited thereto.

As shown in the embodiment of FIG. 21, among the semiconductor chips 2200b, semiconductor chips except the uppermost semiconductor chip may further include a backside insulating layer 5300 on the semiconductor substrate 5010, backside input/output pads 5320 on the backside insulating layer 5300, and through silicon via structures 5310 for electrically connecting the peripheral wirings 5110 of the first structure 5100 and the backside input/output pads 5320 while penetrating the semiconductor substrate 5010 and the backside insulating layer 5300 (e.g., in the vertical direction). Each of the through silicon via structures 5310 may include a through silicon via 5310a and an insulating spacer 5310b surrounding the side surface of the through silicon via 5310a. The semiconductor device 2003B may further include connection structures 5400, such as conductive bumps, disposed below the semiconductor chips 2200b. The connection structures 5400 may electrically connect the semiconductor chips 2200b, and may electrically connect the semiconductor chips 2200b and the package substrate 2100. An underfill material layer 5510 may surround the side surface of the conductive bump.

As shown in the embodiments of FIGS. 20-21, the package substrate 2100 may further include package upper pads 2130 that are connected to interconnection lines 2135 disposed on a plurality of levels. The interconnection lines 2135 are connected to package lower pads 2125. An interlayer insulating layer 2120 surrounds the interconnection lines 2135. The package lower pads 2125 are connected to an external connector 2800, such as a conductive connection ball.

According to an embodiment of the present inventive concepts, the semiconductor chips 2200b further include the dummy pattern D_P in the substrate, so that warpage of the substrate may be prevented or removed.

In concluding the detailed description, those skilled in the art will appreciate that many variations and modifications may be made to the described embodiments without substantially departing from the principles of the present inventive concepts. Therefore, the disclosed embodiments are used in a generic and descriptive sense only and not for purposes of limitation.

What is claimed is:

1. A nonvolatile memory device comprising:
an upper insulating layer;
a first substrate on the upper insulating layer;
an upper interlayer insulating layer on the first substrate;
a plurality of word lines stacked on the first substrate in a first direction and extending through a partial portion of the upper interlayer insulating layer;
a lower interlayer insulating layer on the upper interlayer insulating layer;
a second substrate on the lower interlayer insulating layer;
a lower insulating layer on the second substrate; and
a dummy pattern composed of dummy material, the dummy pattern is disposed in a trench formed in at least one of the first and second substrates, wherein the trench is formed on at least one of a surface where the upper insulating layer meets the first substrate, and a surface where the lower insulating layer meets the second substrate, the trench extending solely within the at least one of the first and second substrates.

2. The nonvolatile memory device of claim 1, wherein:
the trench is formed in both the first substrate and the second substrate; and
the dummy material of the dummy pattern fills the trench formed in both the first substrate and the second substrate.

3. The nonvolatile memory device of claim 1, wherein:
a thinning process is performed on at least one of the first substrate and the second substrate; and
the trench is formed in the at least one of the first substrate and the second substrate which has been subjected to the thinning process.

4. The nonvolatile memory device of claim 3, wherein the thinning process includes a chemical mechanical polishing (CMP) process.

5. The nonvolatile memory device of claim 3, wherein the thinning process includes a grinding process.

6. The nonvolatile memory device of claim 1, wherein the dummy material includes a conductive material.

7. The nonvolatile memory device of claim 1, wherein the dummy material includes an insulating material.

8. The nonvolatile memory device of claim 1, wherein the dummy pattern extends in a same direction that the plurality of word lines extend.

9. The nonvolatile memory device of claim 1, wherein the dummy pattern extends in a direction that intersects a direction in which the plurality of word lines extend.

10. The nonvolatile memory device of claim 1, wherein the dummy pattern extends in a direction in which the plurality of word lines extend and a direction that intersects the direction in which the plurality of word lines extend.

11. A nonvolatile memory device comprising:
an upper insulating layer;
a first substrate on the upper insulating layer;
an upper interlayer insulating layer on the first substrate;
a plurality of word lines stacked on the first substrate in a first direction and extending through a partial portion of the upper interlayer insulating layer;
a channel structure extending in the first direction to penetrate the plurality of word lines and a partial portion of the upper interlayer insulating layer;
a lower interlayer insulating layer on the upper interlayer insulating layer;
a second substrate on the lower interlayer insulating layer;
a lower insulating layer on the second substrate; and
a dummy pattern composed of dummy material, the dummy pattern is disposed in a trench formed in at least one of the first and second substrates, wherein the trench is formed on at least one of a surface where the upper insulating layer meets the first substrate, and a surface where the lower insulating layer meets the second substrate, the trench extending solely within the at least one of the first and second substrates.

12. The nonvolatile memory device of claim 11, wherein:
the trench is formed in both the first substrate and the second substrate; and
the dummy material of the dummy pattern fills the trench formed in both the first substrate and the second substrate.

13. The nonvolatile memory device of claim 11, wherein:
a thinning process is performed on at least one of the first substrate and the second substrate; and
the trench is formed in the at least one of the first substrate and the second substrate which has been subjected to the thinning process.

14. The nonvolatile memory device of claim 11, wherein the dummy material includes a conductive material.

15. The nonvolatile memory device of claim 11, wherein the dummy material includes an insulating material.

16. The nonvolatile memory device of claim 11, wherein the dummy pattern extends in a same direction that the plurality of word lines extend.

17. The nonvolatile memory device of claim 11, wherein the dummy pattern extends in a direction that intersects a direction in Which the plurality of word lines extend.

18. The nonvolatile memory device of claim 11, wherein the dummy pattern extends in a direction in which the plurality of word lines extend and a direction that intersects the direction in which the plurality of word lines extend.

19. A nonvolatile memory system comprising:
a main substrate;
a nonvolatile memory device on the main substrate; and
a controller electrically connected to the nonvolatile memory device on the main substrate,
wherein the nonvolatile memory device includes:
an upper insulating layer;
a first substrate on the upper insulating layer;
an upper interlayer insulating layer on the first substrate;
a plurality of word lines stacked on the first substrate in a first direction and extending through a partial portion of the upper interlayer insulating layer;
a lower interlayer insulating layer on the upper interlayer insulating layer;
a second substrate on the lower interlayer insulating layer;
a lower insulating layer on the second substrate; and
a dummy pattern composed of dummy material, the dummy pattern is disposed in a trench formed in at least one of the first and second substrates, wherein the trench is formed on at least one of a surface where the upper insulating layer meets the first substrate and a surface where the lower insulating layer meets the second substrate, the trench extending solely within the at least one of the first and second substrates.

20. The nonvolatile memory system of claim 19, wherein:
a thinning process is performed on at least one of the first substrate and the second substrate; and
the trench is formed in the at least one of the first substrate and the second substrate which has been subjected to the thinning process.

\* \* \* \* \*